(12) United States Patent
Richardson et al.

(10) Patent No.: US 9,145,250 B2
(45) Date of Patent: *Sep. 29, 2015

(54) PROTECTIVE ENCLOSURE FOR ELECTRONIC DEVICE

(71) Applicant: Otter Products, LLC, Fort Collins, CO (US)

(72) Inventors: Curtis R. Richardson, Fort Collins, CO (US); Douglas A. Kempel, Fort Collins, CO (US)

(73) Assignee: OTTER PRODUCTS, LLC, Fort Collins, CO (US)

( * ) Notice: Subject to any disclaimer, the term of this patent is extended or adjusted under 35 U.S.C. 154(b) by 316 days.

This patent is subject to a terminal disclaimer.

(21) Appl. No.: 13/938,064

(22) Filed: Jul. 9, 2013

(65) Prior Publication Data

US 2013/0300267 A1    Nov. 14, 2013

Related U.S. Application Data

(60) Continuation of application No. 12/560,621, filed on Sep. 16, 2009, now Pat. No. 8,599,547, which is a division of application No. 11/456,157, filed on Jul. 7, 2006, now Pat. No. 7,609,512, which is a (Continued)

(51) Int. Cl.
*G06F 1/16* (2006.01)
*B65D 81/05* (2006.01)
(Continued)

(52) U.S. Cl.
CPC ............ *B65D 81/05* (2013.01); *B65D 81/02* (2013.01); *B65D 81/022* (2013.01); *G06F 1/1626* (2013.01); *G06F 1/1633* (2013.01); *G06F 1/1656* (2013.01); *G06F 1/26* (2013.01); *H01F 38/14* (2013.01); *H05K 5/0017* (2013.01);
(Continued)

(58) Field of Classification Search
CPC ............... G06F 1/1626; G06F 1/1656; G06F 2200/1633; G06F 2200/1634; A45C 2011/001; A45C 2011/002; A45C 2011/003; H04B 1/3888

See application file for complete search history.

(56) References Cited

U.S. PATENT DOCUMENTS 1,065,898 A   6/1913   Goerdes
2,164,221 A   6/1939   Raney et al.
(Continued)

FOREIGN PATENT DOCUMENTS

WO        0051315 A1   8/2000

OTHER PUBLICATIONS

Final Office Action, mailed Jun. 9, 2005, in U.S. Appl. No. 10/645,439, filed Aug. 20, 2003, by Curtis R. Richardson.
(Continued)

*Primary Examiner* — Anthony Q Edwards

(57) ABSTRACT

A protective enclosure for an electronic device such as a laptop computer or tablet computer that comprises a shell that is capable of enclosing and substantially surrounding the electronic device. The shell is substantially watertight, substantially rigid and substantially crush-resistant. The inside of the shell has a hook and loop liner with shock absorbing corner bumpers having hook and loop type bases so that the bumpers may attach at any point on the liner inside the shell to accommodate electronic devices of various sizes and to secure the device inside the enclosure in a shock absorbent suspended manner. The shell may further comprise a USB connector hub for connection to the USB port of a laptop computer or PC tablet enclosed in the protective shell.

12 Claims, 29 Drawing Sheets

Related U.S. Application Data continuation-in-part of application No. 10/937,048, filed on Sep. 8, 2004, now Pat. No. 7,158,376, which is a continuation-in-part of application No. 10/645,439, filed on Aug. 20, 2003, now Pat. No. 6,995,976, which is a continuation of application No. 10/300,200, filed on Nov. 19, 2002, now Pat. No. 6,646,864.

(60) Provisional application No. 60/335,865, filed on Nov. 19, 2001.

(51) Int. Cl.
*H05K 5/06* (2006.01)
*H05K 5/02* (2006.01)
*B65D 81/02* (2006.01)
*G06F 1/26* (2006.01)
*H01F 38/14* (2006.01)
*H05K 5/00* (2006.01)
*H05K 5/03* (2006.01)

(52) U.S. Cl.
CPC ............... *H05K5/02* (2013.01); *H05K 5/0247* (2013.01); *H05K 5/03* (2013.01); *H05K 5/061* (2013.01); *H05K 5/068* (2013.01); *H05K 5/069* (2013.01); *G06F 2200/1632* (2013.01); *G06F 2200/1633* (2013.01); *Y10T 428/24355* (2015.01); *Y10T 428/24413* (2015.01); *Y10T 428/24909* (2015.01); *Y10T 428/25* (2015.01); *Y10T 428/31507* (2015.04); *Y10T 428/31605* (2015.04); *Y10T 428/31692* (2015.04); *Y10T 428/31696* (2015.04)

(56) References Cited

U.S. PATENT DOCUMENTS

| | | | |
|---|---|---|---|
| 2,392,787 A | 1/1946 | Vermot | |
| 2,478,987 A | 8/1949 | Vacheron | |
| 3,023,885 A | 3/1962 | Kindseth | |
| D216,853 S | 3/1970 | Schurman | |
| 3,521,216 A | 7/1970 | Jerair | |
| D220,233 S | 3/1971 | Schurman | |
| 3,590,988 A | 7/1971 | Hollar | |
| 3,665,991 A | 5/1972 | Gillemot et al. | |
| 3,832,725 A | 8/1974 | Cook | |
| 3,860,937 A | 1/1975 | Wolfe | |
| 4,097,878 A | 6/1978 | Cramer | |
| 4,312,580 A | 1/1982 | Schwomma et al. | |
| 4,321,572 A | 3/1982 | Studer et al. | |
| D275,822 S | 10/1984 | Gatland et al. | |
| 4,584,718 A | 4/1986 | Fuller | |
| 4,649,453 A | 3/1987 | Iwasawa | |
| 4,658,945 A | 4/1987 | Muller | |
| 4,658,956 A | 4/1987 | Takeda et al. | |
| 4,683,587 A | 7/1987 | Silverman | |
| 4,686,332 A | 8/1987 | Greanias et al. | |
| 4,703,161 A | 10/1987 | McLean | |
| 4,712,657 A | 12/1987 | Myers et al. | |
| 4,762,227 A | 8/1988 | Patterson | |
| 4,771,299 A | 9/1988 | Gell | |
| 4,803,504 A | 2/1989 | Maeno et al. | |
| 4,836,256 A * | 6/1989 | Meliconi ..................... 206/523 | |
| 4,977,483 A | 12/1990 | Perretta | |
| 4,994,829 A | 2/1991 | Tsukamoto | |
| 5,002,184 A | 3/1991 | Lloyd | |
| 5,025,921 A | 6/1991 | Gasparaitis et al. | |
| 5,092,458 A | 3/1992 | Yokoyama | |
| 5,092,459 A | 3/1992 | Uijanic et al. | |
| D327,646 S | 7/1992 | Hardigg et al. | |
| 5,140,632 A | 8/1992 | Anten | |
| D329,747 S | 9/1992 | Embree | |
| D330,329 S | 10/1992 | Brightbill | |
| 5,164,245 A | 11/1992 | Suzuki | |
| 5,175,873 A | 12/1992 | Goldenburg et al. | |
| D335,220 S | 5/1993 | Ward et al. | |
| 5,227,953 A | 7/1993 | Lindberg et al. | |
| 5,230,016 A | 7/1993 | Yasuda | |
| 5,258,592 A | 11/1993 | Nishikawa et al. | |
| D342,609 S | 12/1993 | Brightbill | |
| 5,301,346 A | 4/1994 | Notarianni et al. | |
| D347,324 S | 5/1994 | Dickenson | |
| D347,732 S | 6/1994 | Wentz | |
| 5,336,896 A | 8/1994 | Katz | |
| 5,360,108 A | 11/1994 | Alagia | |
| 5,365,461 A * | 11/1994 | Stein et al. ..................... 700/298 |
| 5,368,159 A | 11/1994 | Doria | |
| D353,048 S | 12/1994 | VanSkiver et al. | |
| 5,380,968 A | 1/1995 | Morse | |
| 5,383,091 A | 1/1995 | Snell | |
| 5,386,084 A | 1/1995 | Risko | |
| 5,388,691 A | 2/1995 | White | |
| 5,388,692 A | 2/1995 | Withrow et al. | |
| 5,452,829 A | 9/1995 | King et al. | |
| 5,455,466 A | 10/1995 | Parks et al. | |
| 5,505,328 A | 4/1996 | Stribiak | |
| 5,508,479 A | 4/1996 | Schooley | |
| 5,517,434 A | 5/1996 | Hanson et al. | |
| 5,517,683 A | 5/1996 | Collett et al. | |
| 5,541,813 A | 7/1996 | Satoh et al. | |
| 5,548,306 A | 8/1996 | Yates et al. | |
| 5,550,452 A | 8/1996 | Shirai et al. | |
| 5,555,157 A | 9/1996 | Moller | |
| 5,570,780 A | 11/1996 | Miller | |
| 5,583,742 A | 12/1996 | Noda et al. | |
| 5,586,002 A * | 12/1996 | Notarianni ............... 361/679.26 |
| 5,591,039 A | 1/1997 | Matthews | |
| 5,608,599 A | 3/1997 | Goldman | |
| 5,610,655 A | 3/1997 | Wakabayashi et al. | |
| 5,626,222 A | 5/1997 | Aguilera | |
| D381,512 S | 7/1997 | Green | |
| 5,657,459 A | 8/1997 | Yanagisawa et al. | |
| 5,678,204 A | 10/1997 | Naylor | |
| D386,611 S | 11/1997 | Sheu | |
| 5,707,757 A | 1/1998 | Lee | |
| 5,708,707 A | 1/1998 | Halttunen et al. | |
| 5,805,416 A | 9/1998 | Friend et al. | |
| 5,812,188 A | 9/1998 | Adair | |
| 5,831,348 A | 11/1998 | Nishizawa | |
| D402,105 S | 12/1998 | Erickson | |
| 5,850,915 A | 12/1998 | Tajima | |
| 5,859,628 A | 1/1999 | Ross et al. | |
| 5,859,762 A | 1/1999 | Clark et al. | |
| 5,882,602 A | 3/1999 | Savage et al. | |
| D409,374 S | 5/1999 | Laba et al. | |
| D412,062 S | 7/1999 | Potter et al. | |
| 5,923,752 A | 7/1999 | McBride et al. | |
| D413,202 S | 8/1999 | Schmitt et al. | |
| D413,203 S | 8/1999 | Zurwelle et al. | |
| 5,956,291 A * | 9/1999 | Nehemiah et al. ............. 367/131 |
| 5,990,874 A | 11/1999 | Tsumura et al. | |
| 5,996,954 A | 12/1999 | Rosen et al. | |
| 5,996,956 A * | 12/1999 | Shawver ..................... 248/309.1 |
| 6,002,093 A | 12/1999 | Hrehor et al. | |
| D419,297 S | 1/2000 | Richardson et al. | |
| D419,767 S | 2/2000 | Richardson et al. | |
| D419,768 S | 2/2000 | Richardson et al. | |
| 6,031,524 A | 2/2000 | Kunert | |
| 6,041,924 A | 3/2000 | Tajima | |
| 6,043,626 A | 3/2000 | Snyder et al. | |
| 6,049,813 A | 4/2000 | Danielson et al. | |
| D423,772 S | 5/2000 | Cooper et al. | |
| 6,057,668 A | 5/2000 | Chao | |
| 6,058,356 A | 5/2000 | Swanson et al. | |
| 6,068,119 A | 5/2000 | Derr et al. | |
| 6,073,770 A | 6/2000 | Park | |
| 6,075,433 A | 6/2000 | Ono et al. | |
| 6,088,069 A | 7/2000 | Farlow | |
| D429,884 S | 8/2000 | Zurwelle et al. | |
| 6,094,785 A | 8/2000 | Montgomery et al. | |
| 6,128,441 A | 10/2000 | Kamata et al. | |
| 6,132,367 A | 10/2000 | Adair | |
| 6,138,826 A | 10/2000 | Kanamori et al. | |

(56) References Cited

U.S. PATENT DOCUMENTS

| | | | |
|---|---|---|---|
| D433,798 S | 11/2000 | Weinstock |
| 6,147,858 A | 11/2000 | Takahashi |
| 6,155,416 A | 12/2000 | Jaime |
| D439,407 S | 3/2001 | Parker |
| 6,201,867 B1 * | 3/2001 | Koike .................... 379/433.11 |
| 6,215,474 B1 | 4/2001 | Shah |
| 6,217,835 B1 | 4/2001 | Riley et al. |
| D441,954 S | 5/2001 | Parker |
| 6,239,968 B1 | 5/2001 | Kim et al. |
| D443,133 S | 6/2001 | Richardson et al. |
| 6,273,252 B1 | 8/2001 | Mitchell |
| 6,301,100 B1 | 10/2001 | Iwata |
| 6,304,459 B1 | 10/2001 | Toyosato et al. |
| 6,313,892 B2 | 11/2001 | Gleckman |
| 6,313,982 B1 | 11/2001 | Hino |
| 6,317,313 B1 | 11/2001 | Mosgrove et al. |
| 6,331,744 B1 | 12/2001 | Chen et al. |
| 6,347,796 B1 | 2/2002 | Grossman et al. |
| 6,349,824 B1 | 2/2002 | Yamada |
| 6,359,787 B1 | 3/2002 | Peltolehto et al. |
| 6,388,877 B1 | 5/2002 | Canova, Jr. et al. |
| 6,396,769 B1 | 5/2002 | Polany |
| 6,406,758 B1 | 6/2002 | Bottari |
| 6,415,138 B2 | 7/2002 | Sirola et al. |
| 6,417,056 B1 | 7/2002 | Quek et al. |
| 6,426,872 B1 | 7/2002 | Sutton et al. |
| 6,444,297 B1 | 9/2002 | Bischel |
| 6,445,577 B1 | 9/2002 | Madsen et al. |
| 6,456,487 B1 | 9/2002 | Hetterick et al. |
| D464,196 S | 10/2002 | Parker |
| 6,471,056 B1 | 10/2002 | Tzeng |
| D465,330 S | 11/2002 | Parker |
| 6,489,745 B1 | 12/2002 | Koreis |
| 6,494,321 B1 | 12/2002 | Sadow et al. |
| 6,496,685 B2 | 12/2002 | Peterzell et al. |
| D469,427 S | 1/2003 | Ma et al. |
| 6,504,710 B2 | 1/2003 | Sutton et al. |
| D470,659 S | 2/2003 | Story et al. |
| 6,519,141 B2 | 2/2003 | Tseng et al. |
| 6,525,928 B1 | 2/2003 | Madsen et al. |
| 6,532,152 B1 | 3/2003 | White et al. |
| 6,536,589 B2 * | 3/2003 | Chang ........................ 206/320 |
| 6,538,413 B1 | 3/2003 | Beard et al. |
| D472,384 S | 4/2003 | Richardson |
| 6,552,899 B2 | 4/2003 | Ronzani et al. |
| 6,571,056 B2 | 5/2003 | Shimamura et al. |
| 6,574,434 B2 | 6/2003 | Matsuoto et al. |
| 6,585,090 B2 | 7/2003 | Harvey |
| 6,594,472 B1 | 7/2003 | Curtis et al. |
| 6,597,865 B1 | 7/2003 | Negishi et al. |
| 6,604,618 B1 | 8/2003 | Godshaw et al. |
| 6,614,722 B2 | 9/2003 | Polany et al. |
| 6,616,111 B1 | 9/2003 | White |
| 6,617,973 B1 | 9/2003 | Osterman |
| 6,626,362 B1 | 9/2003 | Steiner et al. |
| 6,634,494 B1 * | 10/2003 | Derr et al. ................. 206/305 |
| 6,635,838 B1 | 10/2003 | Kornelson |
| 6,641,921 B2 | 11/2003 | Falaas et al. |
| 6,643,656 B2 | 11/2003 | Peterson |
| 6,646,864 B2 | 11/2003 | Richardson et al. |
| 6,659,274 B2 | 12/2003 | Enners |
| 6,665,174 B1 | 12/2003 | Derr et al. |
| 6,685,493 B2 | 2/2004 | Birkenmaier et al. |
| 6,698,608 B2 | 3/2004 | Parker et al. |
| 6,709,127 B2 | 3/2004 | Lu |
| 6,719,381 B2 | 4/2004 | Cleereman et al. |
| 6,733,870 B2 | 5/2004 | Enlow et al. |
| 6,760,570 B1 | 7/2004 | Higdon, Jr. |
| 6,771,775 B1 | 8/2004 | Widmer |
| 6,772,879 B1 * | 8/2004 | Domotor ................. 206/45.23 |
| 6,781,825 B2 | 8/2004 | Shih et al. |
| 6,785,566 B1 * | 8/2004 | Irizarry ..................... 455/575.8 |
| 6,793,520 B1 | 9/2004 | Wu |
| 6,820,813 B2 | 11/2004 | Salvato et al. |
| 6,844,845 B1 | 1/2005 | Whiteside et al. |
| 6,871,739 B2 | 3/2005 | Lopez |
| 6,892,880 B2 | 5/2005 | Nieves |
| 6,896,134 B2 | 5/2005 | Russell et al. |
| 6,953,126 B2 | 10/2005 | Parker et al. |
| 6,954,405 B2 | 10/2005 | Polany et al. |
| 6,961,434 B2 | 11/2005 | Silverman |
| 6,963,756 B2 | 11/2005 | Lubowicki et al. |
| D513,123 S | 12/2005 | Richardson et al. |
| D513,451 S | 1/2006 | Richardson et al. |
| 6,987,527 B2 | 1/2006 | Kossin |
| D514,808 S | 2/2006 | Morine et al. |
| D515,588 S | 2/2006 | Kirkwood |
| 6,995,976 B2 | 2/2006 | Richardson |
| 6,999,792 B2 | 2/2006 | Warren |
| D516,309 S | 3/2006 | Richardson et al. |
| D516,553 S | 3/2006 | Richardson et al. |
| D516,554 S | 3/2006 | Richardson et al. |
| D516,556 S | 3/2006 | Graziano |
| D516,807 S | 3/2006 | Richardson et al. |
| 7,043,281 B2 | 5/2006 | Huang et al. |
| 7,046,230 B2 | 5/2006 | Zadesky et al. |
| 7,050,712 B2 | 5/2006 | Shimamura |
| 7,054,441 B2 | 5/2006 | Pletikosa |
| 7,069,063 B2 * | 6/2006 | Halkosaari et al. ........ 455/575.8 |
| D526,780 S | 8/2006 | Richardson et al. |
| D530,079 S | 10/2006 | Richardson et al. |
| 7,158,376 B2 * | 1/2007 | Richardson et al. ..... 361/679.56 |
| 7,180,735 B2 | 2/2007 | Thomas et al. |
| 7,194,086 B2 | 3/2007 | Pletikosa |
| 7,194,291 B2 | 3/2007 | Peng |
| D542,524 S | 5/2007 | Richardson et al. |
| 7,214,432 B2 | 5/2007 | Merfeld |
| 7,230,823 B2 | 6/2007 | Richardson et al. |
| 7,263,032 B2 | 8/2007 | Polany et al. |
| D557,264 S | 12/2007 | Richardson et al. |
| D557,897 S | 12/2007 | Richardson et al. |
| 7,312,984 B2 | 12/2007 | Richardson et al. |
| D581,155 S | 11/2008 | Richardson et al. |
| D581,421 S | 11/2008 | Richardson et al. |
| 7,449,650 B2 | 11/2008 | Richardson et al. |
| D587,008 S | 2/2009 | Richardson et al. |
| 7,495,895 B2 | 2/2009 | Carnevali |
| D589,016 S | 3/2009 | Richardson et al. |
| 7,535,799 B2 | 5/2009 | Polany et al. |
| D593,319 S | 6/2009 | Richardson et al. |
| D593,746 S | 6/2009 | Richardson et al. |
| D597,301 S | 8/2009 | Richardson et al. |
| 7,577,468 B2 * | 8/2009 | Begic et al. ................ 455/575.8 |
| D600,908 S | 9/2009 | Richardson et al. |
| 7,594,576 B2 | 9/2009 | Chen et al. |
| 7,609,512 B2 * | 10/2009 | Richardson et al. ..... 361/679.41 |
| D603,602 S | 11/2009 | Richardson et al. |
| 7,613,386 B2 | 11/2009 | Shimamura |
| D605,850 S | 12/2009 | Richardson et al. |
| 7,663,878 B2 * | 2/2010 | Swan et al. .............. 361/679.56 |
| 7,755,975 B2 | 7/2010 | Pettersen et al. |
| 7,907,394 B2 * | 3/2011 | Richardson et al. ....... 361/679.3 |
| 8,068,331 B2 * | 11/2011 | Sauers et al. ............. 361/679.01 |
| 2002/0009195 A1 | 1/2002 | Schon |
| 2002/0027768 A1 | 3/2002 | Tseng et al. |
| 2002/0064981 A1 | 5/2002 | Yu et al. |
| 2002/0065054 A1 | 5/2002 | Humphreys et al. |
| 2002/0071550 A1 | 6/2002 | Pletikosa |
| 2002/0079244 A1 | 6/2002 | Kwong |
| 2002/0085342 A1 | 7/2002 | Chen et al. |
| 2002/0086702 A1 | 7/2002 | Lai et al. |
| 2002/0101707 A1 | 8/2002 | Canova et al. |
| 2002/0126440 A1 | 9/2002 | Webb et al. |
| 2002/0137475 A1 | 9/2002 | Shou |
| 2002/0176571 A1 | 11/2002 | Louh |
| 2002/0195910 A1 * | 12/2002 | Hus et al. .................. 312/223.2 |
| 2003/0006968 A1 | 1/2003 | Solomon |
| 2003/0006998 A1 | 1/2003 | Kumar |
| 2003/0011971 A1 | 1/2003 | Suzuki et al. |
| 2003/0039094 A1 | 2/2003 | Sarkinen et al. |
| 2003/0073462 A1 | 4/2003 | Zatloukal et al. |
| 2003/0091118 A1 | 5/2003 | Lohr |
| 2003/0217940 A1 | 11/2003 | Russell et al. |
| 2003/0232204 A1 | 12/2003 | Tsukaguchi et al. |

(56) References Cited

U.S. PATENT DOCUMENTS

| | | | |
|---|---|---|---|
| 2004/0011616 | A1 | 1/2004 | Rasmussen |
| 2004/0014506 | A1 | 1/2004 | Kemppinen |
| 2004/0097256 | A1 | 5/2004 | Kujawski |
| 2004/0102230 | A1 | 5/2004 | Nuovo |
| 2004/0112776 | A1 | 6/2004 | Lord |
| 2004/0120219 | A1 | 6/2004 | Polany et al. |
| 2004/0154941 | A1 | 8/2004 | Montler |
| 2004/0203486 | A1 | 10/2004 | Shepherd et al. |
| 2004/0214618 | A1 | 10/2004 | Hutchison et al. |
| 2005/0174727 | A1 | 8/2005 | Thomas et al. |
| 2006/0279924 | A1 | 12/2006 | Richardson et al. |
| 2007/0280053 | A1 | 12/2007 | Polany et al. |
| 2007/0297149 | A1 | 12/2007 | Richardson et al. |
| 2008/0309623 | A1 | 12/2008 | Hotelling et al. |
| 2009/0009945 | A1 | 1/2009 | Richardson et al. |

OTHER PUBLICATIONS

Non-Final Office Action, mailed Mar. 10, 2003, in U.S. Appl. No. 10/300,200, filed Nov. 19, 2002, by Curtis R. Richardson.
Non-Final Office Action, mailed May 6, 2004, in U.S. Appl. No. 10/645,439, filed Aug. 20, 2003, by Curtis R. Richardson.
Non-Final Office Action, mailed Sep. 27, 2004, in U.S. Appl. No. 10/645,439, filed Aug. 20, 2003, by Curtis R. Richardson.
Non-Final Office Action, mailed Oct. 19, 2006, in U.S. Appl. No. 11/270,732, filed Nov. 8, 2005, by Curtis R. Richardson.
Non-Final Office Action, mailed Jun. 26, 2007, in U.S. Appl. No. 11/676,986, filed Feb. 20, 2007, by Curtis R. Richardson.
Non-Final Office Action, mailed Dec. 5, 2008, in U.S. Appl. No. 11/456,157, filed Jul. 7, 2006, by Curtis R. Richardson.
U.S. Appl. No. 11/456,157, filed Jul. 7, 2006.
U.S. Appl. No. 11/466,342, filed Aug. 22, 2006.
U.S. Appl. No. 11/768,761, filed Jun. 26, 2007.
U.S. Appl. No. 12/134,120, filed Jun. 5, 2008.
U.S. Appl. No. 12/205,522, filed Sep. 5, 2008.
U.S. Appl. No. 12/251,904, filed Oct. 15, 2008.
U.S. Appl. No. 12/251,161, filed Oct. 14, 2008.
U.S. Appl. No. 29/284,532, filed Sep. 10, 2007.
U.S. Appl. No. 29/298,580, filed Dec. 7, 2007.
U.S. Appl. No. 29/298,581, filed Dec. 7, 2007.
U.S. Appl. No. 29/284,641, filed Sep. 12, 2007.
U.S. Appl. No. 29/321,167, filed Jul. 11, 2008.
U.S. Appl. No. 29/324,499, filed Sep. 12, 2008.
U.S. Appl. No. 29/326,563, filed Oct. 20, 2008.
U.S. Appl. No. 29/327,554, filed Nov. 7, 2008.
U.S. Appl. No. 29/328,643, filed Nov. 26, 2008.
U.S. Appl. No. 29/328,645, filed Nov. 26, 2008.
U.S. Appl. No. 29/328,650, filed Nov. 26, 2008.
U.S. Appl. No. 29/328,959, filed Dec. 4, 2008.
U.S. Appl. No. 29/338,837, filed Jun. 19, 2009.
U.S. Appl. No. 29/338,840, filed Jun. 19, 2009.
U.S. Appl. No. 29/338,842, filed Jun. 19, 2009.
U.S. Appl. No. 29/338,835, filed Jun. 19, 2009.
U.S. Appl. No. 29/338,909, filed Jun. 19, 2009.
U.S. Appl. No. 29/338,910, filed Jun. 19, 2009.
U.S. Appl. No. 29/339,632, filed Jul. 2, 2009.
U.S. Appl. No. 29/339,633, filed Jul. 2, 2009.
U.S. Appl. No. 29/339,634, filed Jul. 2, 2009.
U.S. Appl. No. 29/342,332, filed Aug. 21, 2009.
U.S. Appl. No. 29/342,333, filed Aug. 21, 2009.
U.S. Appl. No. 29/343,1272, filed Sep. 8, 2009.
U.S. Appl. No. 29/343,071, filed Sep. 4, 2009.
U.S. Appl. No. 29/341,066, filed Jul. 30, 2009.
U.S. Appl. No. 61/141,097, filed Dec. 29, 2008.
U.S. Appl. No. 10/645,439, filed Aug. 20, 2003.
U.S. Appl. No. 10/937,048, filed Sep. 8, 2004.
U.S. Appl. No. 11/077,963, filed Mar. 10, 2005.
U.S. Appl. No. 11/270,732, filed Nov. 8, 2005.
U.S. Appl. No. 60/805,833, filed Jun. 26, 2006.
U.S. Appl. No. 60/807,726, filed Jul. 19, 2006.
U.S. Appl. No. 29/205,706, filed May 18, 2004.
U.S. Appl. No. 29/205,708, filed May 18, 2004.
U.S. Appl. No. 29/205,722, filed May 18, 2004.
U.S. Appl. No. 29/205,723, filed May 18, 2004.
U.S. Appl. No. 29/205,848, filed May 21, 2004.
U.S. Appl. No. 29/209,918, filed Jul. 22, 2004.
U.S. Appl. No. 29/211,554, filed Aug. 17, 2004.
U.S. Appl. No. 29/217,612, filed Nov. 18, 2004.
U.S. Appl. No. 29/217,613, filed Nov. 18, 2004.
U.S. Appl. No. 29/225,168, filed Mar. 11, 2005.
U.S. Appl. No. 29/246,914, filed May 19, 2006.
U.S. Appl. No. 29/246,912, filed May 19, 2006.
U.S. Appl. No. 29/246,913, filed May 19, 2006.

* cited by examiner

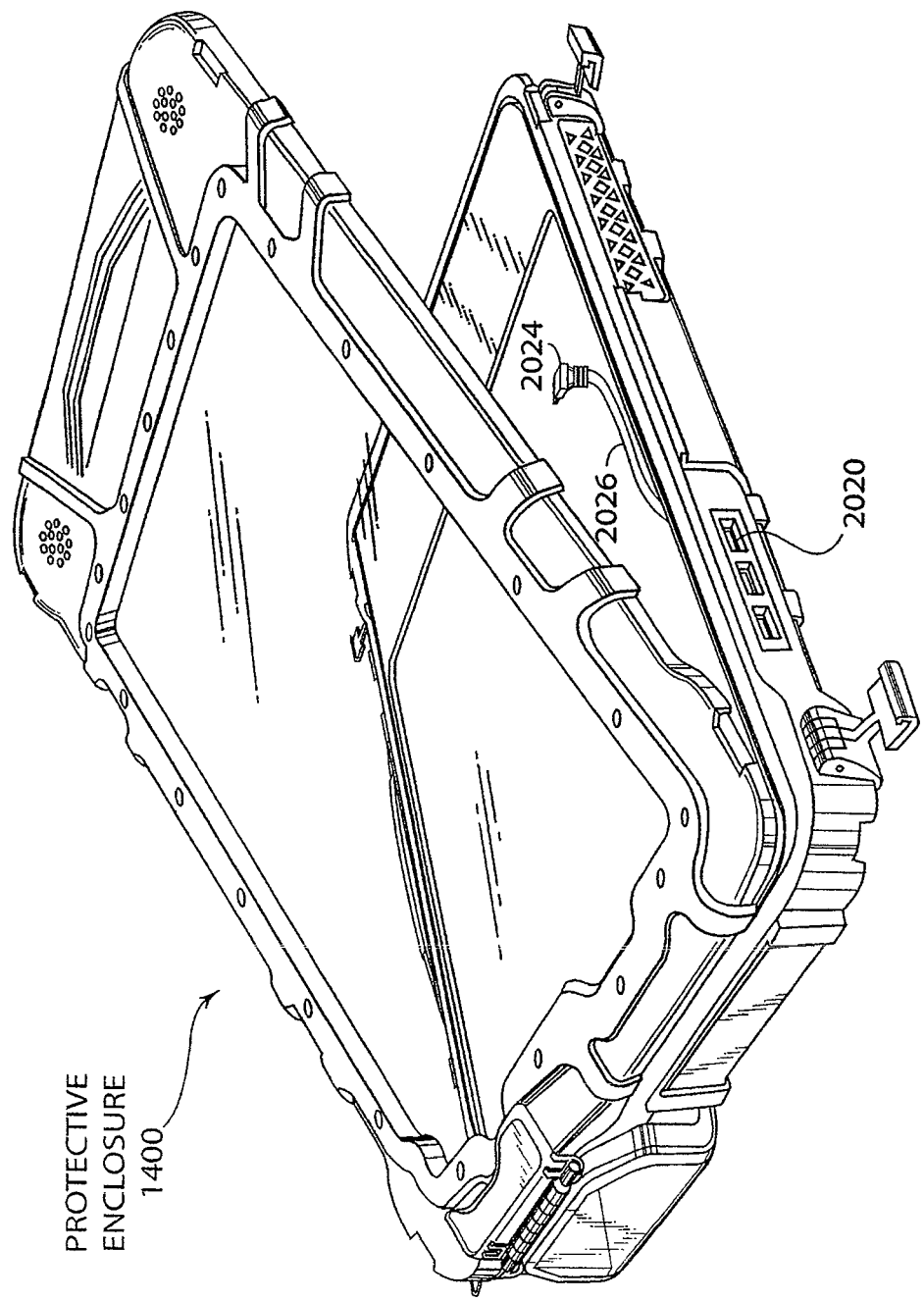

PROTECTIVE ENCLOSURE FOR ELECTRONIC DEVICE

CROSS REFERENCE TO RELATED APPLICATIONS

This application is a continuation of U.S. application Ser. No. 12/560,621 filed Sep. 16, 2009; which application is a divisional application of U.S. patent application Ser. No. 11/456,157, entitled "Protective Enclosure for Electronic Device," by Curtis R. Richardson, filed Jul. 7, 2006, issued as U.S. Pat. No. 7,609,512 on Oct. 27, 2009; which application is a continuation-in-part of U.S. patent application Ser. No. 10/937,048 entitled "Protective Enclosure for an Interactive Flat-Panel Controlled Device" by Curtis R. Richardson et al., filed Sep. 8, 2004, now U.S. Pat. No. 7,158,376. U.S. patent application Ser. No. 10/937,048 is a continuation-in-part of U.S. patent application Ser. No. 10/645,439 entitled "Protective Membrane to Touch Screen Device" by Curtis R. Richardson and Douglas A. Kempel, filed Aug. 20, 2003, now U.S. Pat. No. 6,995,976. U.S. patent application Ser. No. 10/645,439 is a continuation of U.S. patent application Ser. No. 10/300,200 entitled "Protective Case for Touch Screen Device" by Curtis R. Richardson, filed Nov. 19, 2002, now U.S. Pat. No. 6,646,864 which claims the benefit of and priority to U.S. Provisional Patent Application Ser. No. 60/335,865 filed Nov. 19, 2001 by Curtis R. Richardson entitled "Protective Case for Touch Screen Device." The entire contents of the above mentioned applications are hereby specifically incorporated herein by reference for all they disclose and teach.

BACKGROUND OF THE INVENTION

Portable electronic devices (PEDs), such as PDAs, computers, MP3 players, music players, video players, smart phones, GPS receivers, telematics devices, cell phones, satellite phones, pagers, monitors, etc., are being very widely used, and are being deployed in industrial as well as office environments. PEDs are being used in industrial environments for data collection, such as service information on an airplane, or for data delivery such as maps for fire fighters and other emergency personnel. When PEDs are deployed in such industrial applications, the data that is collected and displayed on the PED can be extremely valuable and can be life saving.

The industrial environments impose harsh conditions that typical PEDs are not designed to accommodate. For example, damage can be done to the PED through rough handling and dropping. Further, industrial chemicals, grease, water, dirt, and grime may damage or destroy a functioning PED and inhibit the use of the PEDs valuable data.

It is common to hold the PEDs inside a protective case for transport. However, PEDs are usually removed for use since most cases used for transport are not interactive. Interactive cases are also useful for non-industrial applications to provide protection for PEDs.

SUMMARY OF THE INVENTION

The present invention overcomes the disadvantages and limitations of the prior art by providing a watertight, crush-resistant, and impact resistant protective enclosure that protects devices that have an interactive flat-panel control as well as computer laptop devices. The present invention may therefore comprise a protective enclosure for a computer laptop or tablet PC having an interactive flat-panel control. The enclosure comprises a foam type shock-absorbing hook and loop cushioned lining inside the protective enclosure. Movable corner bumpers are disposed to attach to the hook and loop type cushioned lining at any point in the enclosure to accommodate devices of various sizes and snuggly fit at the corners of an electronic device to secure the electronic device inside the protective enclosure. The corner bumpers are disposed to secure the electronic devices inside the enclosure in a suspended shock absorbing manner.

BRIEF DESCRIPTION OF THE DRAWINGS

In the drawings,

FIG. 28 is a perspective view of the USB hub mounted inside the enclosure of FIG. 14.

DETAILED DESCRIPTION OF THE PREFERRED EMBODIMENTS

Figure 1:
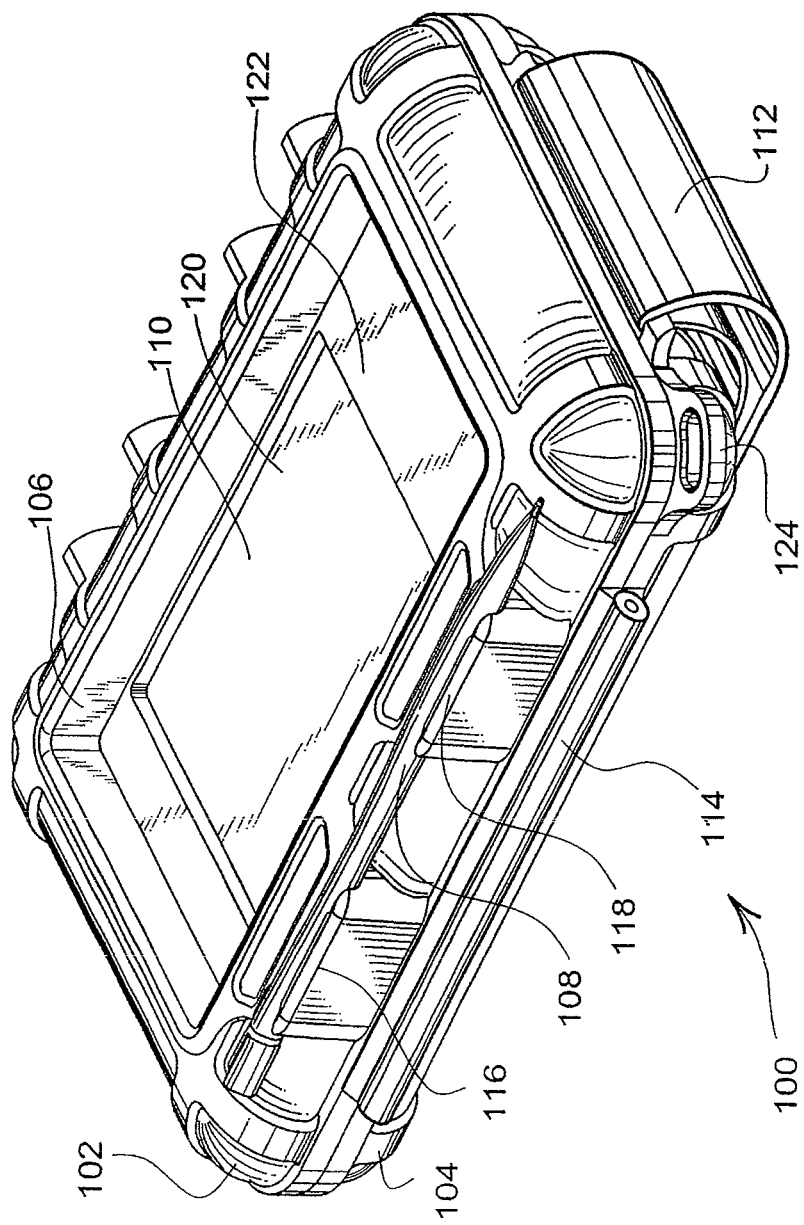
FIG. 1 is a perspective view of an embodiment of the invention shown in the closed position.

FIG. 1 is a perspective view of an embodiment of the invention. Embodiment 100 comprises a rigidly molded front case 102 and rear case 104. An overmolded grommet 106 forms a receptacle for stylus 108 and also aids in sealing membrane 110. A flexible hand strap 112 attaches to the rear case 104. A hinge 114 joins front case 102 and rear case 104. A ring 124 for a lanyard is shown as an integral feature of rear case 104.

Embodiment 100 is designed to hold a conventional personal digital assistant (PED) in a protective case. A PED, such as a Palm Pilot, Handspring Visor, Compaq Ipaq, Hewlett Packard Jornada, or similar products, use a touch screen for display and data entry. The touch screen display comprises either a color or black and white liquid crystal display with a touch sensitive device mounted on top of the display. The display is used for displaying graphics, text, and other elements to the user. The touch screen is used with a stylus 108 to select elements from the screen, to draw figures, and to enter text with a character recognition program in the PED. The stylus 108 generally resembles a conventional writing implement. However, the tip of the writing implement is a rounded plastic tip. In place of a stylus 108, the user may use the tip of a finger or fingernail, or a conventional pen or pencil. When a conventional writing implement is used, damage to the touch screen element may occur, such as scratches.

For the purposes of this specification, the term PED shall include any electronic device that has a touch screen interface. This may include instruments such as voltmeters, oscilloscopes, logic analyzers, and any other hand held, bench top, or rack mounted instrument that has a touch screen interface. Hand held devices, such as cell phones, satellite phones, telemetric devices, and other hand held devices are also to be classified as PEDs for the purposes of this specification. The term PED shall also include any computer terminal display that has a touch screen interface. These may comprise kiosks, outdoor terminal interfaces, industrial computer interfaces, commercial computer interfaces and other computer displays. Additionally, the term PED may comprise barcode scanners, hand held GPS receivers, and other handheld electronic devices. The foregoing description of the term PED has been presented for purposes of illustration and description. It is not intended to be exhaustive or to limit the invention to the precise forms disclosed, and other modifications and variations may be possible in light of the teachings of this specification.

In addition, the PEDs typically have a handful of additional buttons as part of the user interface. These buttons are generally on the front of the device, near the touch screen element. The additional buttons may be used as shortcut buttons to instantly call up a certain program on the PED, may comprise a method of scrolling, may be used to select items from a list, or may have any function that the designer of the PED software may assign to the button or set of buttons. The button size, layout, and function may vary for each manufacturer and model of PED.

Further, PEDs typically have at least one method of connecting to another computer. This may be through a direct electrical connection, such as through a wire cable or fiber optic, or through another medium such as infrared communication or through a radio communication.

Additionally, the PEDs typically have an electrical source. The electrical source may be a rechargeable or non-rechargeable battery or solar cells. The electrical source may be a remote source of electricity that is transmitted to the PED through a wire cable or through other methods of electrical transmission.

Further, PEDs may have indicator lights, such as status lights for power, communication, battery status, or other functions. The lights may be located on any of the sides of the PED and may be viewable on one or more sides.

Front case 102 and rear case 104 form a protective cover for the PED. The protective cover may be designed for rugged industrial use, recreational use, commercial use, or many other uses. An industrial use may require the protective cover to be watertight, chemically resistant, protect the unit when dropped, and be crush proof. A typical application may be for fire fighters to use a PED for a display of maps for directions to an emergency scene or for a building plan at the scene of a fire. Another example may be a maintenance mechanic in a chemical plant using a PED to record maintenance records in the plant that processes. A recreational use may require the cover to be watertight, afford some protection against dropping and being crushed, float in water, and be dust resistant. A recreational use may be to take the PED during kayaking, diving, or other water sport activity. Further, the case may be used when the PED is taken camping, hiking, or other outdoor activity. A commercial use may additionally require the protective cover to be elegant, but may also require the cover to be replaceable so that scratches and other signs of wear and tear can be easily and cheaply replaced.

The protective cover for the PED may take on many embodiments. The embodiment 100 comprises a front case 102 and rear case 104 that are joined by a hinge 114 and a clasp mechanism that is on the side of the cases opposite the hinge 114. Other embodiments may have a small door into which the PED slides, or the protective cover may not completely enclose the PED and only cover the face where the user interface exists, leaving one or more sides of the PED exposed. Those skilled in the art may use other designs of protective covers without deviating from the scope and intent of the present invention.

The protective cover may be constructed of rigid plastic, metal, flexible rubber, or any other type of material that could be adapted to afford the protection of the PED desired for the application. For example, a metal cover may be used in an application where an elegant style is necessary but watertightness is not. A flexible rubber cover may be selected for an application in a wet environment. A rigid plastic cover may be selected for an application where dropping the PED is a concern. Those skilled in the art may use other types of materials and constructions without deviating from the spirit of the present invention.

The PED may be mounted in the protective cover using many different mounting techniques. For example, the PED may be mounted using open or closed cell foam inserts in the protective cover. In another embodiment, the PED may be mounted by attaching the PED to the cover with a fastener. In another embodiment, the PED may be mounted by snapping into the protective waterproof cover. In another embodiment, the PED may be held in place by resting in molded features of two halves of a protective case that clamps onto the PED. Those skilled in the art may use other types of locating and holding mechanisms without deviating from the spirit of the present invention.

The overmolded grommet 106 of the present embodiment is constructed by injection molding a thermoplastic polymerized rubber (TPR) over the front case 102. The grommet 106 has molded features 116 and 118 adapted to retain the stylus 108. Features 116 and 118 capture the stylus 108 during transportation, but allow the user to remove the stylus 108 to operate the PED. In other embodiments of the present invention, the stylus 108 may be constrained to the PED with a tether or lanyard, or the constraining features may be incorporated into other components that make up the protective cover. Further, the stylus 108 may not be present in the embodiment, rather, the PED be adapted to be used with the user's fingernail or with another implement similar to the stylus 108.

The membrane 110 of the present embodiment is constructed by thermoforming a sheet of thin plastic. The plastic is selected to be thin enough that the deformation of a stylus conducts the touch to the touch screen, but thick enough to have enough rigidity that the stylus does not catch and rip the membrane. Additionally, the membrane 110 should have enough thickness to endure scratches and other wear and tear without breaking and sacrificing the protective function. Polyvinylchloride material at 0.010 in to 0.015 in thickness gives acceptable results. Alternatively, membrane 110 may be constructed by injection molding or other methods. Alternative materials may be used by those skilled in the art to achieve the same results while maintaining within the spirit and intent of the present invention.

The membrane 110 in the present embodiment may be translucent or at least partially transparent, so that the images displayed on the PED may be visible through the membrane 110. The membrane 110 may be tinted or colorized in some applications. For example, a protective cover designed as a decorative cover may incorporate a colorized membrane 110. Further, the membrane may be selectively colorized and the opaqueness may vary. For example, the protective membrane may be printed or painted in the areas not used for the touch screen. A printing process may incorporate a logo, graphics, or labeling for individual buttons for the PED. The printing process may further incorporate features, such as text or graphics, that are used by the software on the PED for a purpose such as simplifying data input or for designating an area on the touch screen for a specific function, such as a help function. The printing or painting processes used on the membrane 110 may be purely decorative and may be for aesthetic purposes only. The printing process may also comprise logos or graphics for the brand identity of the PED cover. Other processes, such as colorizing the raw material for the membrane 110 or adding other components to the raw material, such as metal flakes or other additives, may be used to change the optical features of the membrane 110.

The optical performance of the membrane 110 may be changed or enhanced by changing the texture of the area of the touch screen. For example, the membrane may be frosted on the outside to hide scratches or may be imprinted with a lens or other features that change the optical characteristics of the membrane 110. The membrane 110 may have optical features that are used in conjunction with the software of the PED. For example, all or a portion of the membrane may comprise a lens that magnifies an image to a user. When the user touches the image on the membrane 110 and the touch is transferred to the touch screen, the software in the PED may have to compensate for the positional differences between the image and actual area that was touched by the user. In another example, if a specific portion of the membrane 110 had a specific optical characteristic, the software of the PED may be constructed to display a specific graphic for the area for an intended effect.

The membrane 110 in the present embodiment has a recessed portion 120 and a raised portion 122. The recessed portion 120 may be adapted to press flat against the touch screen area of a specific PED. The raised portion 122 may be adapted to fit over an area of the specific PED where several buttons are located.

The raised portion 122 allows the user to operate the buttons on the PED. The raised portion 122 is adapted such that the buttons on the PED are easily operated through the protective membrane 110. The raised portion 122 may have special features to aid the user in pressing the buttons. For example, the raised portion 122 may comprise a dimpled area for the user's finger located directly over the button. Further, a feature to aid the user may comprise a section of membrane 110 defined by a thinner area around the section, enabling the user to more easily deflect the section of membrane over the button. The area of thinner material may comprise a large section or a thin line. Further, tactile elements, such as small ribs or bumps may be incorporated into the membrane 110 in the area of the buttons so that the user has a tactile sensation that the user's finger is over the button. The tactile element may be particularly effective if the button was a power switch, for example, that turned on the PED.

The configuration of the membrane 110 may be unique to each style or model of PED, however, the front case 102 and rear case 104 may be used over a variety of PEDs. In the present embodiment, the changeover from one PED variety to another is accomplished by replacing the membrane 110 without having to change any other parts. The present embodiment may therefore be mass-produced with the only customizable area being the membrane 110 to allow different models of PEDs to be used with a certain front case 102 and rear case 104.

The hand strap 112 in the present embodiment allows the user to hold the embodiment 100 securely in his hand while using the PED. The hand strap 112 may be constructed of a flexible material, such as rubber or cloth webbing, and may have an adjustment, such as a buckle, hook and loop fastener, or other method of adjustment. In other embodiments, a hand strap may be a rigid plastic handle, a folding handle, or any other method of assisting the user in holding the embodiment. Further, the embodiment may be adapted to be fix-mounted to another object, like a piece of machinery, a wall, or any other object. A fix-mounted embodiment may have other accoutrements adapted for a fixed mount applications, such as receptacles for a stylus adapted to a fix-mount, specialized electrical connections, features for locking the PED inside the case to prevent theft, or designs specifically adapted to shed water when rained upon.

Figure 2:
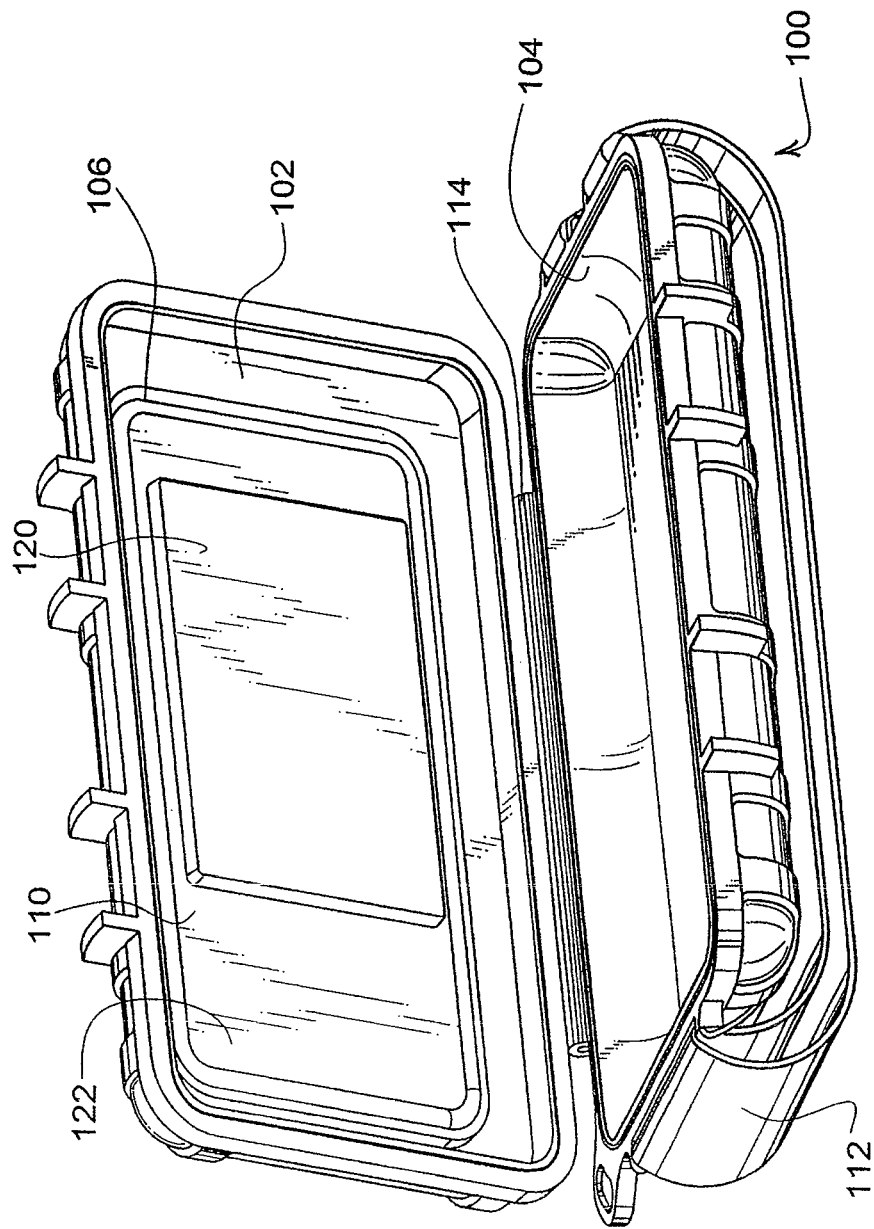
FIG. 2 is a perspective view of an embodiment of the invention shown in the open position.

FIG. 2 illustrates a perspective view of the embodiment 100 shown in an open position. The front case 102 and rear case 104 are shown open about the hinge 114. Membrane 110 is shown installed into gasket 106, and the recessed portion 120 and raised portion 122 of membrane 110 is illustrated looking from the inside of the case. The clasp mechanisms are not shown in this illustration. Hand strap 112 is shown attached to rear case 104.

Figure 3:
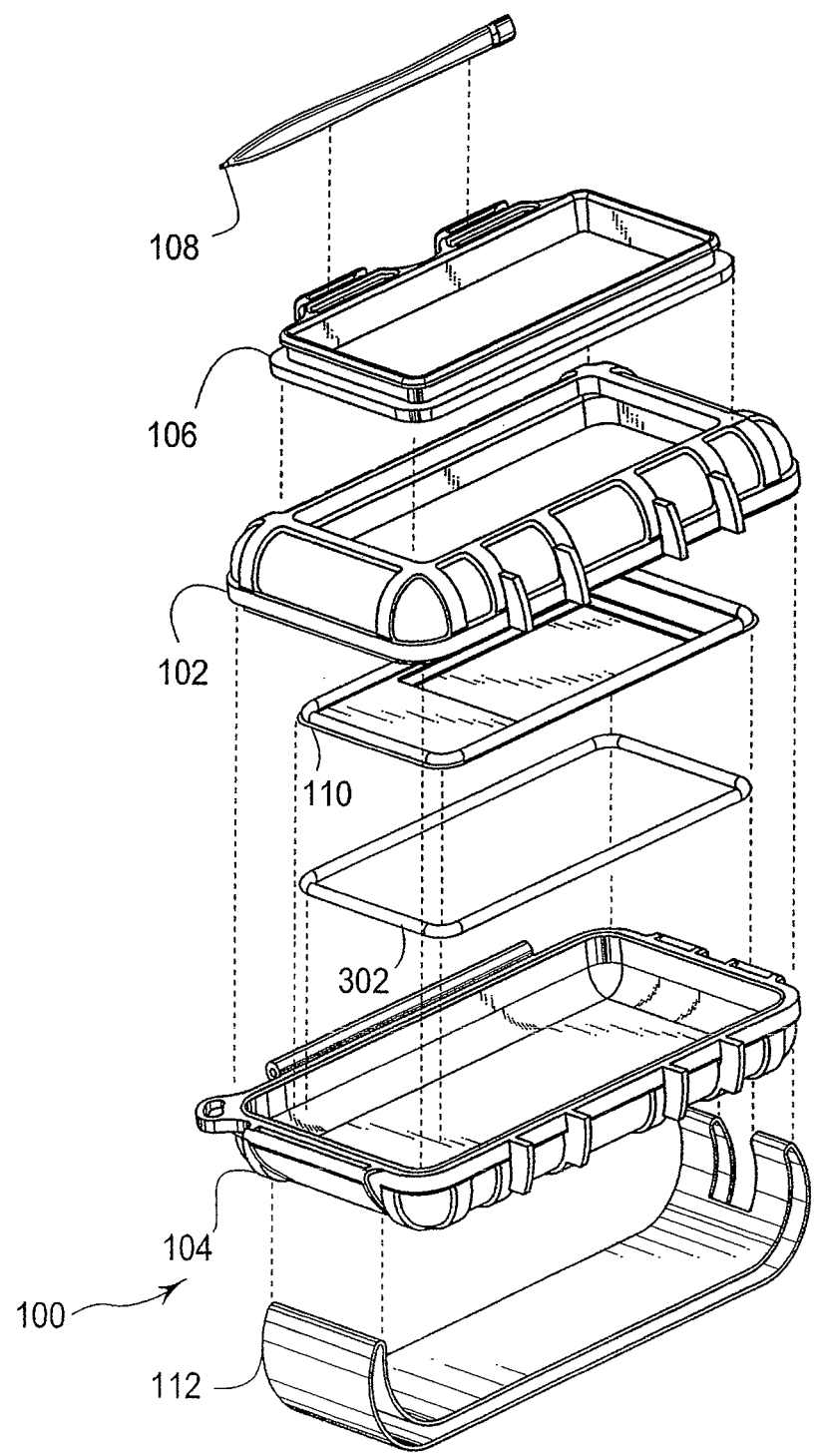
FIG. 3 is a perspective view of an embodiment of the invention shown in an exploded state.

FIG. 3 illustrates a perspective view of the embodiment 100 shown in an exploded state. The hand strap 116 attaches to the rear cover 104. The overmolded grommet 106 holds the stylus 108 and is attached to front cover 102. The membrane 110 attaches to the grommet 106 and is held in place with an o-ring 302.

Figure 4:
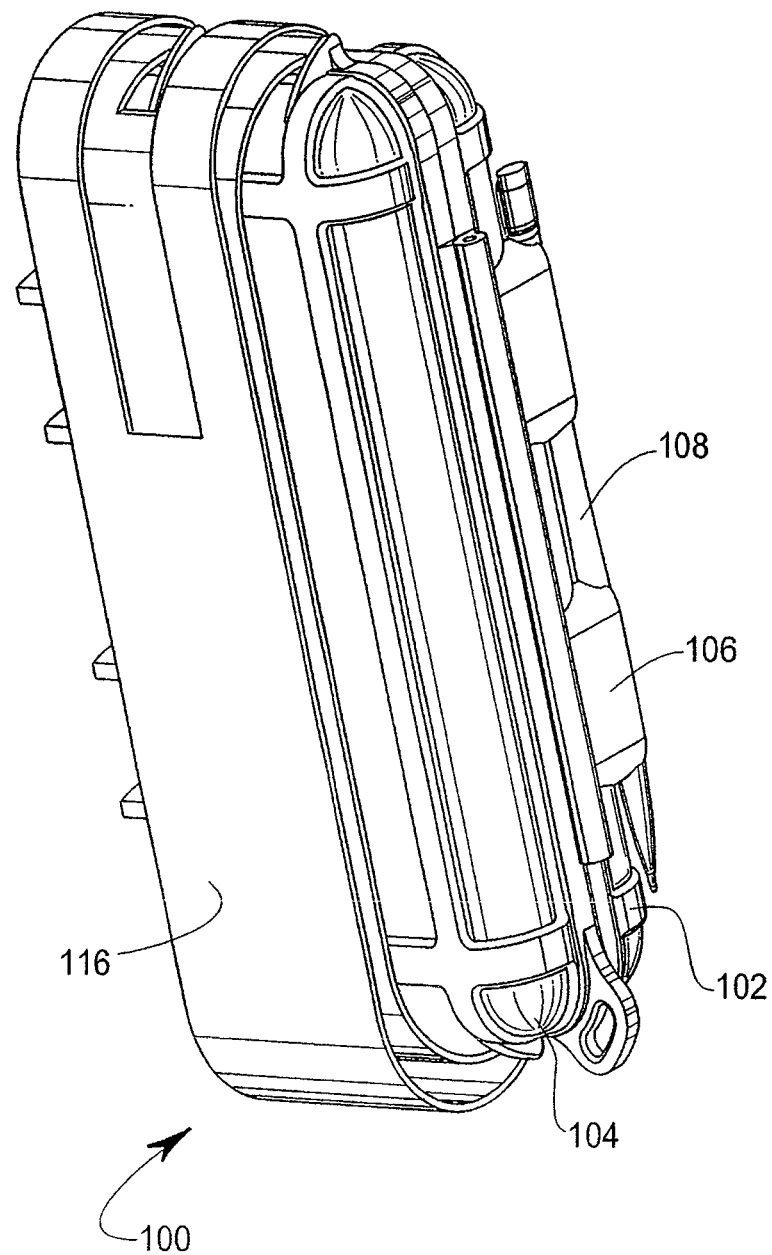
FIG. 4 is a perspective view of an embodiment of the invention shown from the rear.

FIG. 4 illustrates a perspective view of the embodiment 100 shown from the rear. The hand strap 116 is shown, along with rear cover 104 and front cover 102. The stylus 108 is shown inserted into the overmolded grommet 106.

Figure 5:
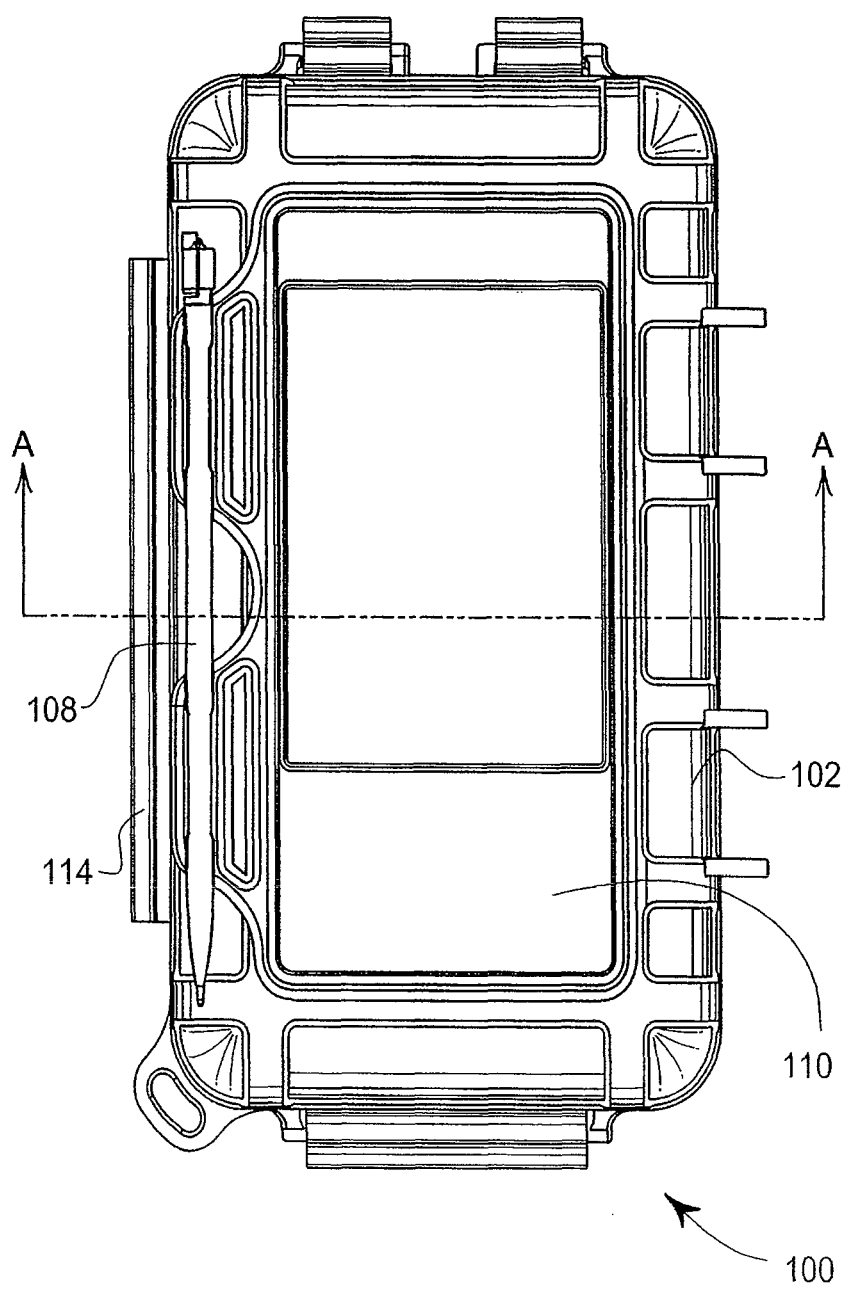
FIG. 5 is a front view of an embodiment of the invention, showing a section line.

FIG. 5 illustrates a top view of the embodiment 100. The front cover 102, membrane 110, stylus 108, and hinge 114 are all visible.

Figure 6:
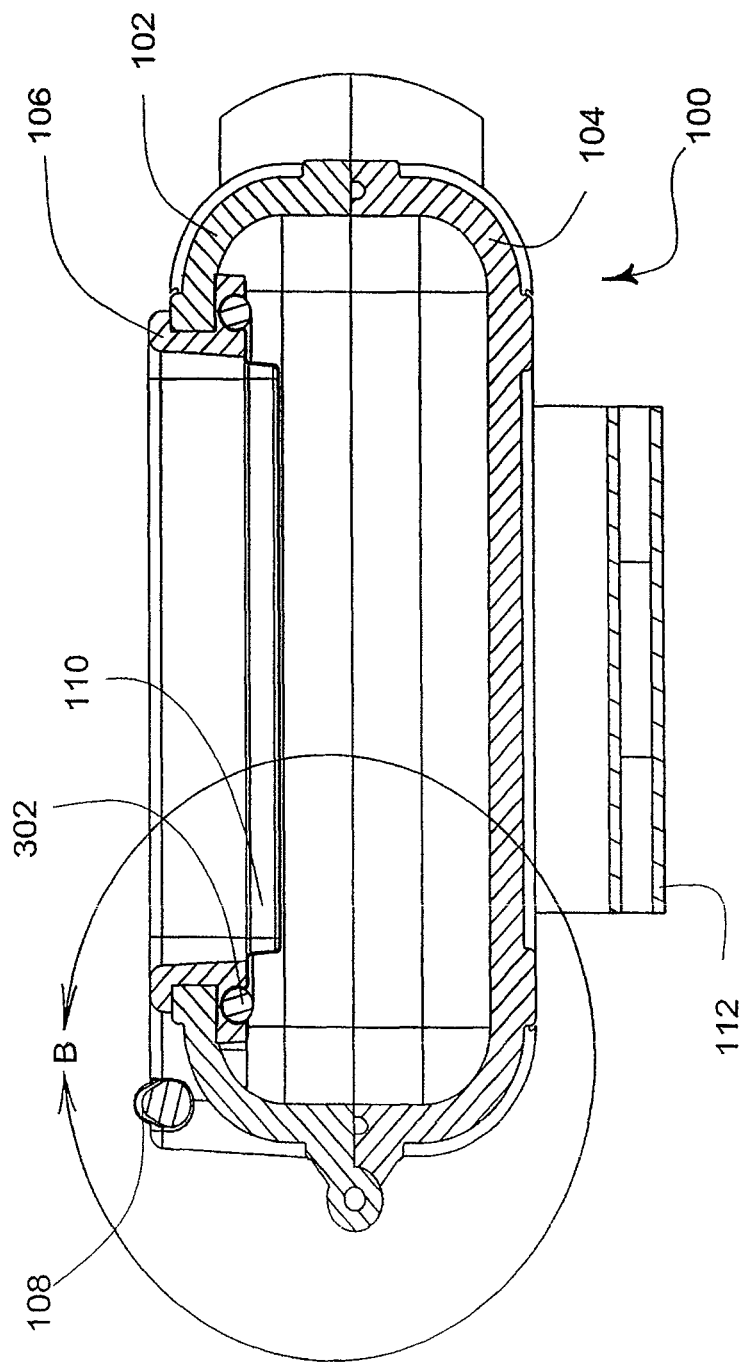
FIG. 6 is a section view of an embodiment of the invention.

FIG. 6 illustrates a section view of the embodiment 100 taken through the section line shown in FIG. 5. The front cover 102, rear cover 104, overmolded gasket 106, stylus 108, membrane 110, hand strap 112, and o-ring 302 are all shown hatched in this view.

Figure 7:
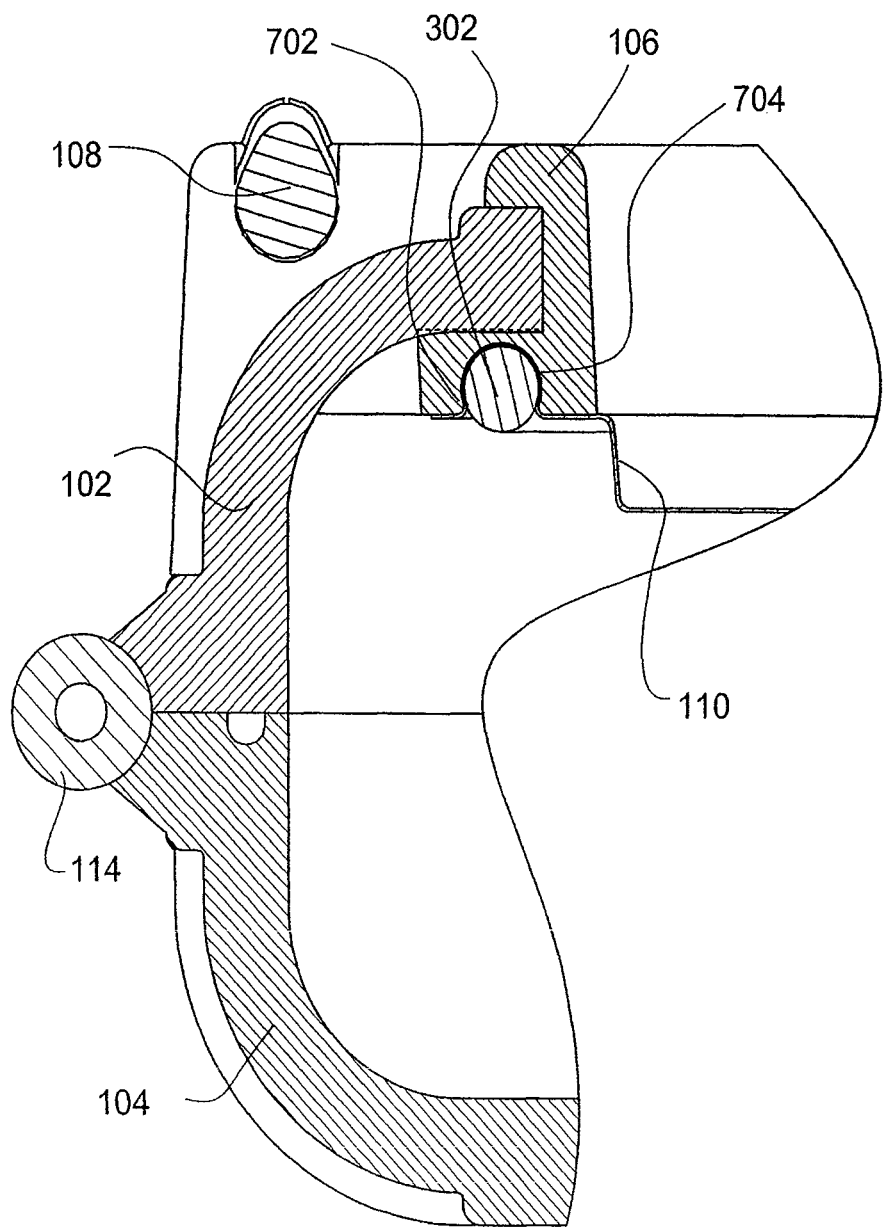
FIG. 7 is a detailed view of a section shown in FIG. 6.

FIG. 7 illustrates a detail view of the embodiment 100 shown in FIG. 6. Front case 102 and rear case 104 are joined at hinge 114. Overmolded gasket 106 traps membrane 110 and o-ring 302 locks membrane 110 in place. Overmolded gasket 106 may be formed by molding thermoplastic polymerized rubber over the front cover 102.

The replacement of the membrane 110 is accomplished by removing o-ring 302, pushing the membrane 110 from the overmolded gasket 106, snapping a new membrane 110 into place, and replacing the o-ring 302. The ease of replacement of the present embodiment allows a user to quickly replace a damaged membrane 110, allows a user to upgrade their case to a newer model PED, and may allow a user to select from various membranes 110 for the particular application. One embodiment may have a single case packaged with a small variety of several types of membranes 110. In such an embodiment, the user may purchase the packaged set, select the membrane 110 that suits the user's particular PED, and install the selected membrane 110 with ease.

The protective cover of the present invention may have direct connections through the cover for connecting through the case. Such a connection is known as pass through. The connections may be for power, communication, heat dissipation, optical transmissions, mechanical motion, or other reasons.

Electrical connections may require an insulated metal conductor from the PED through the wall of the protective cover so that a flexible cable may be attached or so that the PED in its protective case may be placed in a cradle for making the electrical connection. Inside the protective cover, the electrical connections may be made with a flexible cable that is plugged into the PEDs electrical connector before the PED is secured in the protective cover. Alternatively, a fixed connector may be attached to the protective cover and the PED is slid into contact with the fixed connector. Another embodiment may be for a compliant, yet fixed mounted electrical connector to be rigidly mounted inside the protective cover. A compliant, yet fixed mounted electrical connector may comprise spring loaded probes, commonly referred to as pogo pins. Another embodiment may comprise spring fingers that engage the PEDs electrical contacts. On the outside of the protective cover, the electrical contacts may be terminated into a fix-mounted connector adapted to receive a cable from a computer. The connector may be designed to receive a cable that plugs directly into the PED or it may be adapted to receive a different connector. Further, the electrical connection to the PED may be permanently attached to a cable that extends out of the protective cover. Another embodiment may be to have a small trap door that opens in the protective cover to allow access to the electrical connections. While the trap door exposes the PED to the elements the cover is designed to protect against, a direct electrical connection may eliminate a potential cabling connection problem. Connections for fiber optics can be handled in similar fashions as the electrical connections. An embodiment with a power connection may comprise the use of inductive coils located in proximity to each other but on opposite sides of the protective cover. Those skilled in the art of may devise other embodiments for connecting through the protective cover without deviating from the scope and intent of the present invention.

Through the air communications, such as infrared and over the air radio frequency (RF) communications may pass through the protective cover. The material for the front case 102 and rear case 104 may be selected to be clear plastic, such as polycarbonate. The infrared transceiver of the PED can communicate through a clear plastic case to another infrared transceiver outside of the case. Further, the appropriate selection of material for the protective case can thereby enable various RF transmissions, such as cellular phone communications or other wireless communication protocols.

An infrared transmission through the protective case of an embodiment of the invention may be accomplished by making the entire protective case out of a clear material. Alternatively, a selected area of the protective case may be clear while the remainder of the case is opaque. The selected area may be constructed of a separate piece that allows the infrared light through the protective case. Alternatively, the selected area may be constructed of a portion of the protective case that was manufactured in a way so as not to be opaque, such as selectively not painting or plating the area of a plastic protective case. Further, the clear material through which the transmission occurs may be tinted in the visual spectrum but be translucent or at least partially transparent in the infrared spectrum of the device.

A protective case may allow RF transmissions to and from the PED while the case is closed. Such a case may be constructed of a non-metallic material. In some embodiments, the material of the protective case may be tuned to allow certain frequencies to pass through the protective cover and tune out other frequencies, through loading the material used in the protective cover with conductive media or through varying the thickness of the case and other geometries of the case in the area of the PED transmission and reception antenna.

In a different embodiment, it may be desirable to shield the PED from outside RF interference. In this case, the protective cover may be a metallic construction or may be plastic with a metallized coating. Further, membrane 110 may have a light metallized coating applied so that membrane 110 is slightly or fully conductive. An application for such an embodiment may be the use of the PED in an area of high RF noise that may interfere with the operation of the PED, or conversely, the use may be in an area that is highly susceptible to external RF interference and the PEDs RF noise may be interfering with some other device.

The PED may be equipped with a camera or other video capture device. A protective cover may have provisions to allow a clear image to be seen by the video capture device through the case. Such provisions may include an optically clear insert assembled into the protective case. Other embodiments may have a sliding trap door whereby the user of the PED may slide the door open for the camera to see. Additionally, other embodiments may comprise a molded case that has an optically clear lens integrally molded. Such an embodiment may be additionally painted, plated, or overmolded, with the lens area masked so that the painting, plating, or overmolding does not interfere with the optics of the lens.

An optically clear area may be used for a barcode scanner portion of a PED to scan through the case to the outside world. In such an embodiment, a barcode scanner may be protected from the elements while still maintaining full functionality in the outside world.

The PED may have indicator lights that indicate various items, such as power, battery condition, communication, and other status items. The indicator lights may be in positions on the PED that are not readily viewable through the protective membrane 110. The indicator lights may be made visible through the protective case by using light pipes that transmit the light from the PEDs status light to the outside of the protective case. Such light pipes may be constructed of clear or tinted plastic, or other translucent or semi-transparent material. The light pipes may be formed as an integral feature to the protective case or may be separate parts that are formed separately and assembled to the protective case.

The PED may have a speaker or other element that makes noise and/or the PED may have a microphone for receiving audio signals. The speaker may be an audio quality device for reproducing sound or it may be a simple buzzer for indicating various functions of the PED. The microphone may be an audio quality device or it may be a low performance device. Special provisions may be made for transmitting sound through a protective case. Such provisions may range from a single hole in the case to a tuned cavity that would allow sound to pass through with minimum distortion. Other embodiments may include a transmissive membrane adapted to allow sound to pass through the protective case with a minimum of distortion. Such membranes may be located near the speaker and microphone elements of the PED. Such membranes may be watertight membranes known by the brand name Gore-Tex.

The PED may generate heat during its use and provisions for dissipating the heat may be built into the protective cover. A heat-dissipating device may be integral to the protective cover or may comprise one or more separate parts. For example, a metallic protective cover may be adapted to touch the PED in the area of heat generation and conduct the heat outwardly to the rest of the protective cover. The protective cover may thereby dissipate the heat to the external air without overheating the PED. In another example, a separate heat sink may be applied to the PED and allowed to protrude through a hole in the protective cover. The heat sink may thereby transfer the heat from the PED to the ambient environment without overheating the PED. The heat sinks may be attached to the PED with a thermally conductive adhesive. Other embodiments may include vent holes for heat dissipation and air circulation.

The PED may have a button that may not be located underneath the membrane 110. An embodiment may include a flexible, pliable, or otherwise movable mechanism that may transmit mechanical motion from the outside of the case to a button on the PED. Such an embodiment may have a molded dimpled surface that is pliable and allows a user to activate a button on a PED by pressing the dimpled surface. Another embodiment may have a rigid plunger that is mounted on a spring and adapted to transmit the mechanical movement from the exterior of the case to a button on the PED. The buttons on the PED may be located on any side of the PED and an embodiment of a case may have pliable areas adapted to allow the user to press buttons that are not on the front face of the PED.

Figure 8:
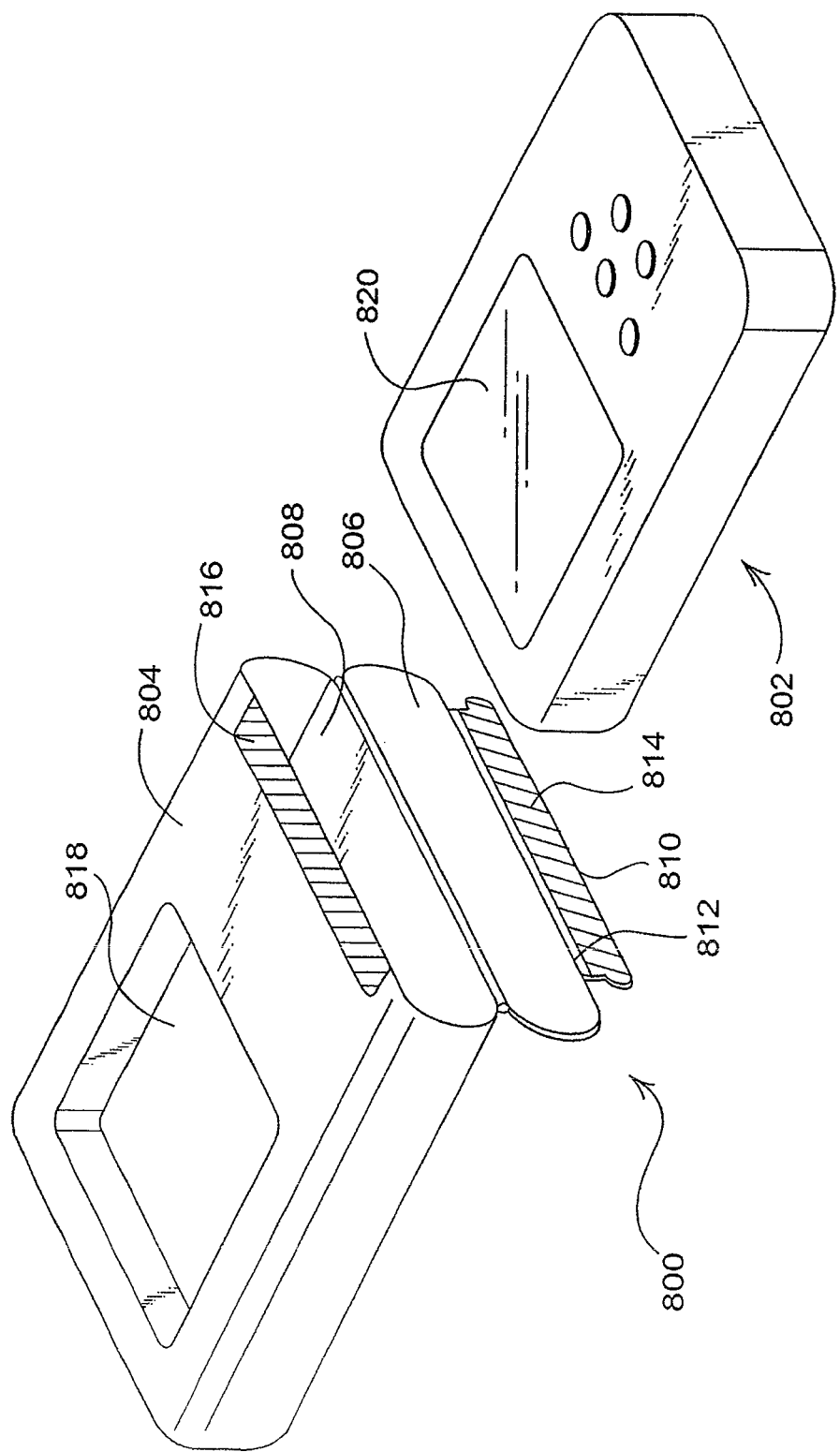
FIG. 8 is a perspective view of another embodiment comprising a single piece encapsulating cover.

FIG. 8 is an illustration of embodiment 800 of the present invention wherein the PED 802 is encapsulated by a protective cover 804. The installation of the PED 802 is to slide PED 802 into the opening 808, then fold door 806 closed and secure with flap 810, which is hinged along line 812. Areas 814 and 816 may comprise a hook and loop fastener system or other fastening device. Recessed area 818 is adapted to fit against touch screen 820 of PED 802.

Embodiment 800 may be comprised of a single molded plastic part that may be very low cost. As shown, embodiment 800 may not be completely weathertight, since the door 806 does not completely seal the enclosure. However, such an embodiment may afford considerable protection to the PED 802 in the areas of dust protection, scratch protection, and being occasionally rained upon. Further, the low cost of the embodiment 800 may be changed often during the life of the PED 802.

Embodiment 800 may have custom colors, logos, or designs that allow a user to personalize their PED with a specific cover that is suited to their mood or tastes. The colors, logos, and designs may be integrally molded into the cover 804. Alternatively, different colors, logos, and designs may be applied in a secondary operation such as printing, painting, plating, or other application process.

Figure 9:
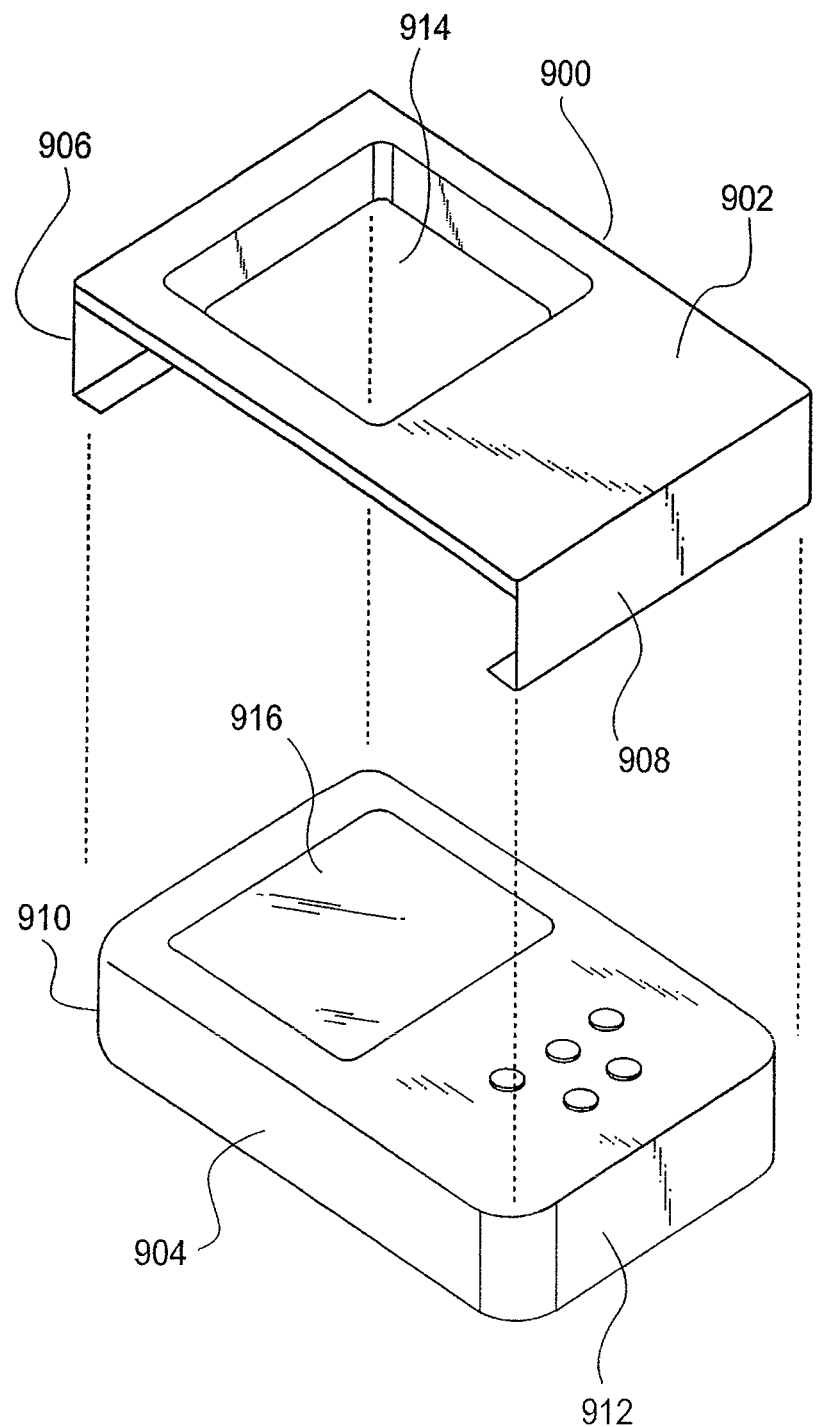
FIG. 9 is a perspective view of a third embodiment comprising a non-encapsulating snap over cover.

FIG. 9 is an illustration of embodiment 900 of the present invention wherein a decorative cover 902 is snapped over a PED 904. The ends 906 and 908 snap over the PED ends 910 and 912 as an attachment mechanism for cover 902 to PED 904. Recessed area 914 is adapted to fit against touch screen 916.

Embodiment 900 may be a cover for decorative purposes only, or may be for protective purposes as well. Cover 902 may be emblazoned with logos, designs, or other visual embellishments to personalize the PED 904. The colors, logos, and designs may be integrally molded into the cover 904. Alternatively, different colors, logos, and designs may be applied in a secondary operation such as printing, painting, plating, or other application process.

Embodiment 900 may be attached by snapping the cover 902 onto PED 904. Special provisions in the case of PED 904 may be provided for a snapping feature of cover 902, or cover 902 may be adapted to hold onto PED 904 without the use of special features in PED 904.

The features used to secure cover 902 to PED 904 may be any mechanism whereby the cover 902 can be secured. This includes snapping, clamping, fastening, sliding, gluing, adhering, or any other method for securing two components together.

Figure 10:
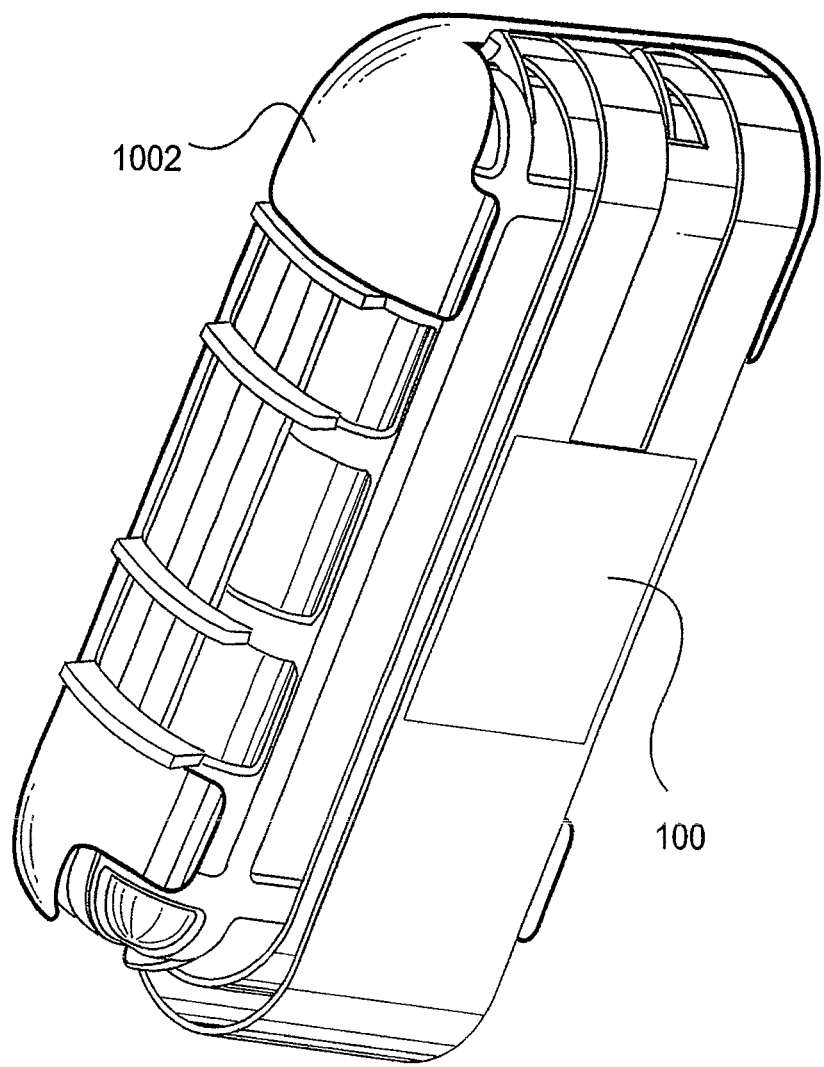
FIG. 10 is a perspective view of an embodiment that comprises a belt clip.

FIG. 10 illustrates a perspective view of an embodiment of a receiver 1002 for holding the protective case 100. The protective case 100 is held into receiver 1002 in such a manner that the touch screen display is facing into the receiver 1002, to afford the touch screen display with protection.

Figure 11:
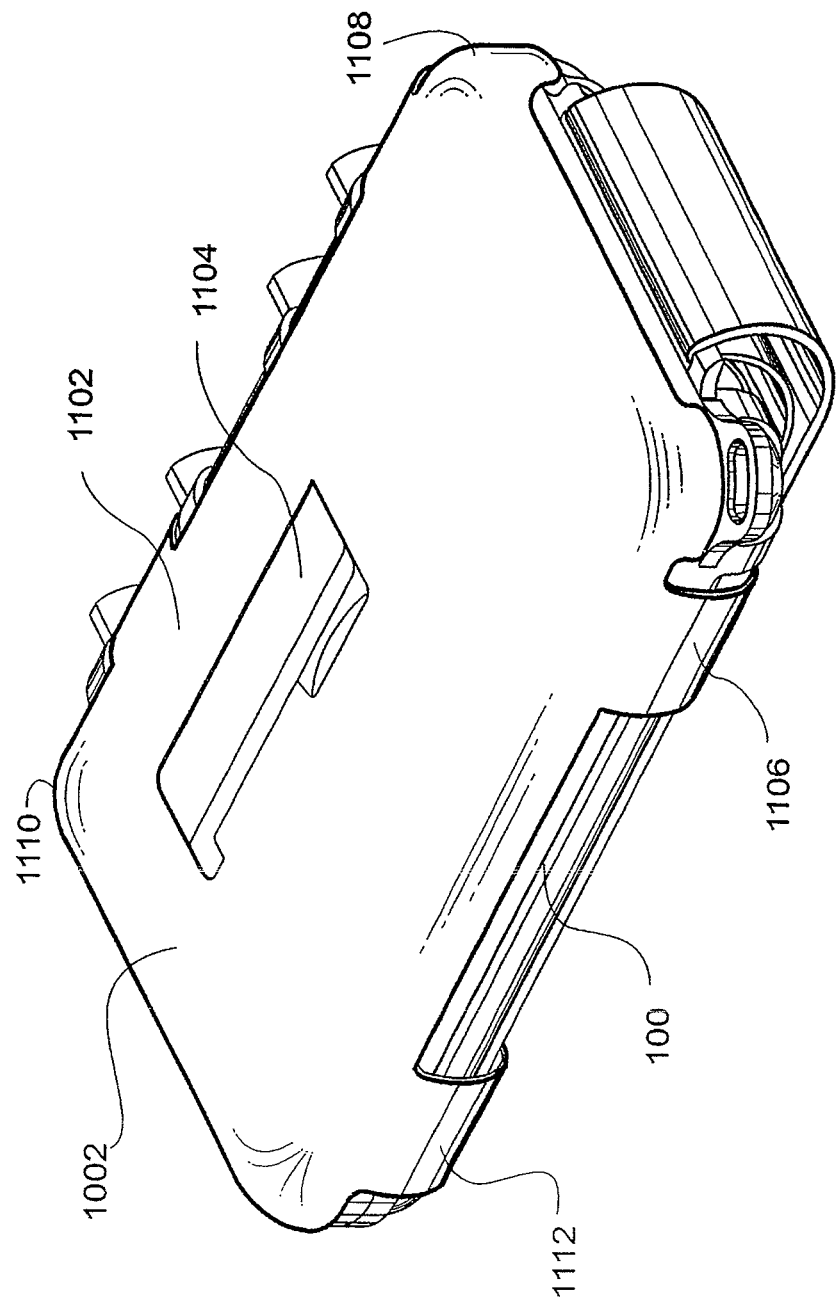
FIG. 11 is a second perspective view of an embodiment that comprises a belt clip.

FIG. 11 illustrates a perspective view of the embodiment of a receiver 1002 shown from the opposite side as FIG. 10. Receiver 1002 is comprised of a back 1102, a belt clip mechanism 1104, and four clip areas 1106, 1108, 1110, and 1112. The protective case 100 is placed into the receiver 1002 by inserting one end into the receiver, then rotating the protective case 100 into position such that the snapping action of clip areas 1106, 1108, 1110, and 1112 are engaged to hold protective case 100 securely.

Receiver 1002 may be adapted to clip onto a person's belt or may be adapted to be mounted on a wall or other location where the PED may be stored. The orientation of the protective case 100 is such that the touch screen element of the PED is protected during normal transport and storage, since the touch screen interface is facing the back 1102 of the receiver 1002.

Receiver 1002 may be made of compliant plastic that allows the clip areas 1106, 1108, 1110, and 1112 to move out of the way and spring back during insertion or removal of the protective case 100. In the present embodiment, receiver 1002 may be constructed of a single part. In alternative embodiments, receiver 1002 may be constructed of multiple parts and of multiple materials, such as a metal back with spring loaded clips. In other embodiments, special features may be included in the protective case 100 where the receiver 1002 may engage a special feature for securing the protective case 100.

Figure 12:
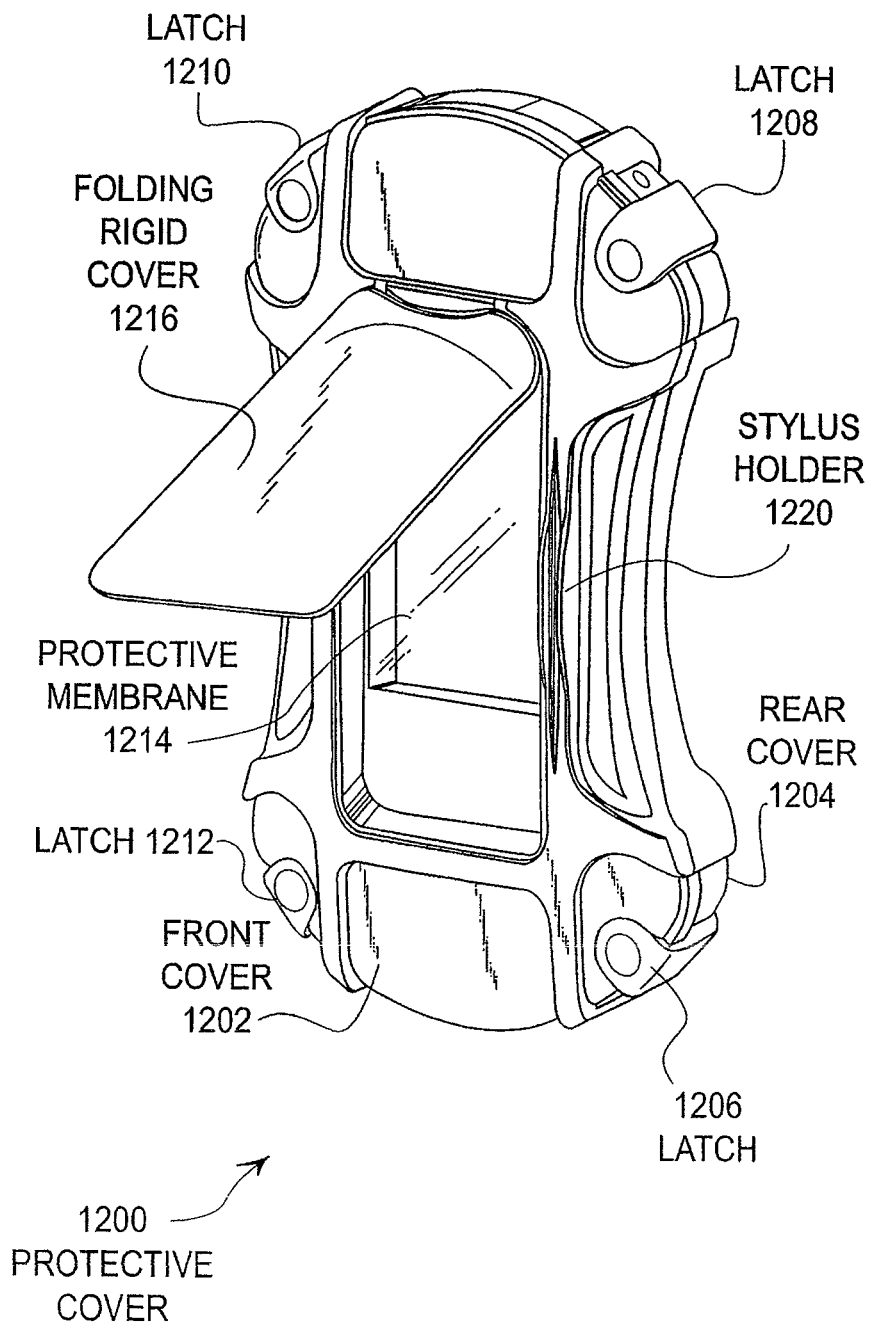
FIG. 12 is a perspective view of another embodiment of the present invention of a protective cover for a PED or other device.

FIG. 12 illustrates an embodiment 1200 of the present invention of a protective cover for a PED or other device. A rigid front cover 1202 and a rigid rear cover 1204 are held together with a series of latches 1206, 1208, 1210, and 1212. The protective membrane 1214 protects the touchscreen of the enclosed PED. A folding rigid cover 1216 operates as a rigid shield to prevent the membrane 1214 from any damage. The stylus holder 1220 is formed from an overmolded flexible material in which the membrane 1214 is mounted.

Embodiment 1200 illustrates yet another embodiment of the present invention wherein a rigid protective cover may be used to contain and protect an electronic device, but provide full usable access to a touchscreen. The protective membrane 1214 and case may be watertight in some embodiments.

Figure 13A:
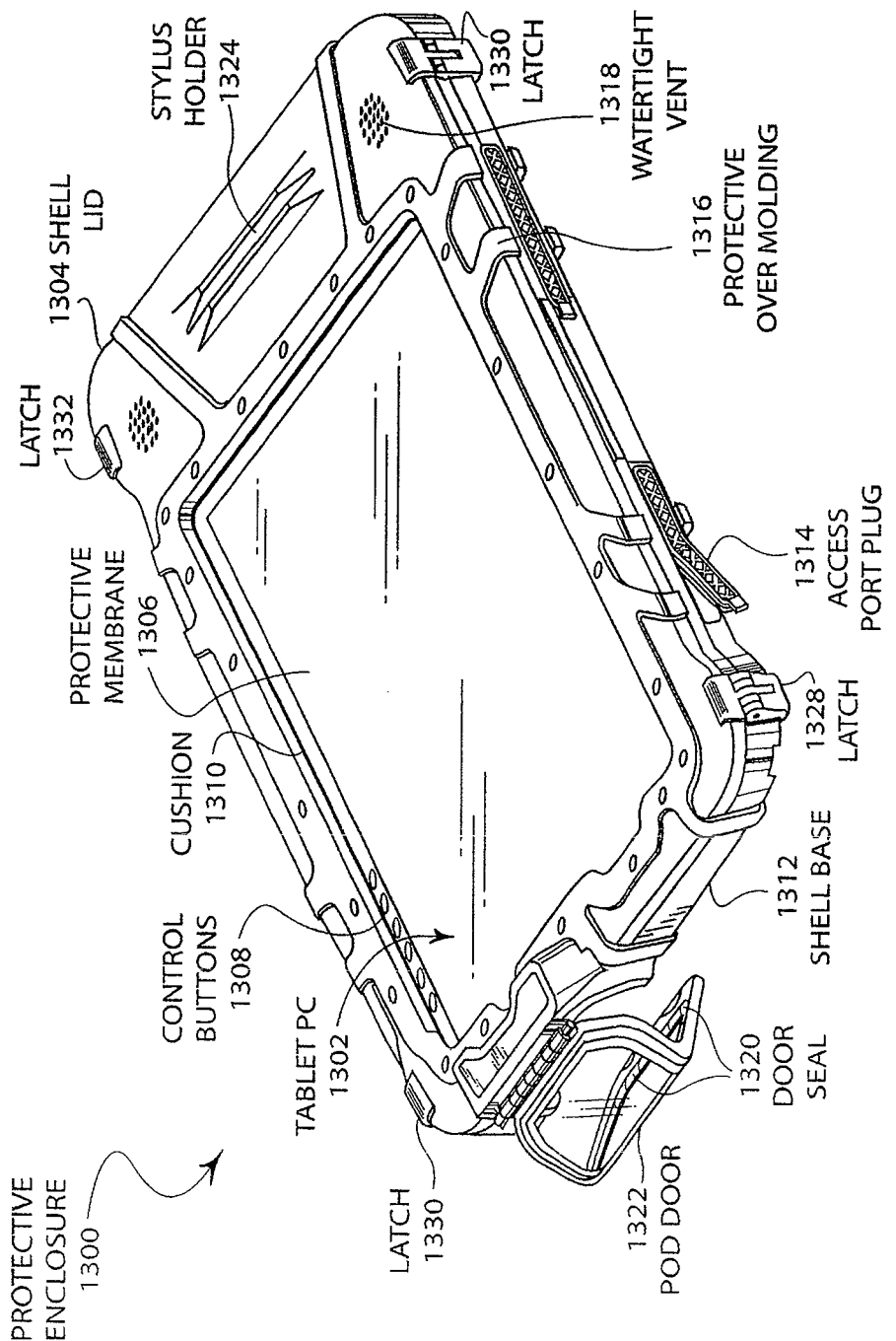
FIG. 13A is a perspective top view of another embodiment of a protective enclosure for a tablet PC.

FIG. 13A illustrates an embodiment of a protective enclosure 1300 that encloses and protects a tablet PC 1302. PEDs that have touch screens, as described above, have an interactive flat-panel control, i.e., the touch screen display. Tablet PCs are portable electronic computing devices that have a high-resolution interactive flat-panel control that accepts smooth stylus strokes such as handwriting. The embodiment of FIG. 13A is crush-resistant, impact-resistant, watertight, and simultaneously allows interactive stylus strokes and other sensitive user inputs to be accurately and easily transmitted through a protective screen membrane 1306 to the interactive flat-panel control of tablet PC 1302.

A watertight and shock-absorbing foam cushion 1310 may be fixed and sealed to the underside of the lid 1304 around the interactive flat-panel control opening. The protective screen membrane 1306 is fixed and sealed to the shock-absorbing foam cushion 1310. The shock-absorbing foam cushion 1310 maintains the water tightness of the enclosure. The cushion 1310 also cushions the flat-panel control of the tablet PC 1302 and protects it against breakage if the enclosure and tablet PC are dropped or otherwise subjected to shock. In accordance with the embodiment of FIG. 13A, the shock-absorbing foam cushion 1310 has a thickness of approximately 0.25 inches and extends approximately 0.060 inches below the underside of the interactive flat-panel control opening of the lid 1304. One source of suitable watertight shock-absorbing foam is E.A.R. Specialty Composites of 7911 Zionville Rd., Indianapolis, Ind. 46268. Cushion 1310 allows the protective screen membrane to move a distance of up to 0.125 inches during an impact to the enclosure or when pressure is applied to protect membrane 1306 while pushing the tablet PC control buttons 1308 or writing on the interactive flat-panel control with a stylus through the membrane. The shock-absorbing foam cushion 1310 also pushes the protective screen membrane 1306 flatly against the surface of the interactive flat-panel control of the tablet PC 1302 so that sensitive user stylus strokes and other inputs are accurately transmitted. The pressure of the cushion 1310 on the protective screen membrane 1306 which holds the protective screen membrane 1306 flatly against the interactive flat-panel control of the tablet PC 1302 also keeps display images, viewed through the protective screen membrane, clear and distortion-free. In embodiments of the protective enclosure to protect a touch-screen device, the protective membrane may be adjacent to the touch screen but does not exert mechanical pressure on the touch screen so that mechanical inputs such as style strokes are sensed only when intended. In embodiments of the protective enclosure to protect a tablet PC that has an RF stylus or to protect a handheld device that a capacitance-sensing interactive flat-panel control, the protective membrane may be pressed flat against the interactive flat-panel control which allows undistorted viewing but does not adversely affect the control since the interactive control uses capacitance or radio frequencies for interactive input instead of mechanical pressure.

The protective screen membrane 1306 in the embodiment of FIG. 13A is at least partially transparent and has a thickness of approximately 0.010 inches. The thickness of the protective screen membrane 1306 should be typically in the range of 0.001 inches to 0.020 inches so that stylus strokes on the upper surface of protective screen membrane 1306 are transmitted accurately to the interactive flat-panel control of the tablet PC 1302. Likewise, protective screen membrane 1306 may be flexible or semi-rigid and may be made of polyvinylchloride or other suitable transparent thermoplastic, such as, for example, polyvinylchloride, thermoplastic polycarbonate, thermoplastic polypropylene, thermoplastic acrylonitrile-butadiene-styrene, thermoplastic polyurethane, which has a hardness and texture that permits the stylus to smoothly glide across the surface without skipping, grabbing, or catching against the surface. Some tablet PCs utilize a stylus which transmits strokes to the PC by way of radio frequency transmission. Protective screen membrane 1306 may be made of a rigid, clear, engineered thermoplastic such as, for example, thermoplastic polycarbonate or other thermoplastics as described above, for enclosing a tablet PC. A protective screen membrane 1306 that is rigid may include watertight access ports that allow operation of mechanical buttons or switches of the tablet PC 1302, such as, for example, control buttons 1308. The watertight access ports may include holes that have a moveable watertight plug, or any type of watertight button or lever. Protective screen membrane 1306 may include an anti-glare coating or can be made with an anti-glare texture so that display images are clearly viewable without distortion through the protective screen membrane 1306.

In the embodiment of FIG. 13A, the lid 1304 of the protective enclosure 1300 may have an external stylus holder 1324 that securely holds a stylus used with the tablet PC 1302.

As described above with respect to FIG. 1, the lid 1304 and the base 1312 may have air-permeable watertight vents 1318, 1326 that permit the cooling fans of the tablet PC 1302 to force air exchange to dissipate heat by convection so that the tablet PC 1302 does not overheat. Watertight vents 1318, 1326 may comprise holes in the lid 1304 and base 1312 that are made watertight by covering and sealing the holes with an air-permeable watertight membrane such as, for example, a fabricated expanded polytetrafluoroethylene (ePTFE) membrane. One source that fabricated expanded polytetrafluoroethylene (ePTFE) membranes is available from is W. L. Gore & Associates, Inc. of 555 Papermill Road, Newark, Del. 19711.

The embodiment of FIG. 13A may also comprise a pod door 1322 that allows access to table PC interfaces such as, for example, PCMCIA or Smart Card slots. The pod door 1322 is attached to the lid 1304 so that it may be removed or opened. In the embodiment of FIG. 13A, the pod door 1322 is hingedly connected to a portion of the base 1312 at a location of the base 1312 that has an opening that allows access to the tablet PC interfaces. The opening can be covered by a watertight seal 1320, such as, for example, an O-ring that is part of pod door 1322.

The underside of the lid 1304 also has a watertight seal, such as an O-ring, so that when compound latches 1328, 1330, 1332 and 1334 are closed, the O-ring or seal of the lid 1304 forms a watertight seal against the base 1312. The protective enclosure 1300 protects the tablet PC 1302 from water and dust intrusion sufficient to comply with Ingress Protection (IP) rating of IP 67, i.e., the protective enclosure totally protects the enclosed tablet PC from dust and protects the enclosed tablet PC from the effects of immersion in one meter of water for 30 minutes.

The protective enclosure of the embodiment of FIG. 13A may further comprise protective overmolding 1316 attached to the lid 1304. A similar overmolding may be attached to the base 1312. The protective overmolding 1316 may be made of material that is easily gripped in slippery conditions and provides additional shock absorption such as, for example, rubber or silicone. The protective overmolding 1316 extends above the surface of the lid in pre-determined areas to provide protrusions that are easily gripped even in slippery conditions. The protective enclosure of the embodiment of FIG. 13 may further comprise watertight plugs such as access port plug 1314 that fit snugly into openings in the base 1312 that provide access to various interfaces, connecters and slots of the tablet PC 1302.

Figure 13B:
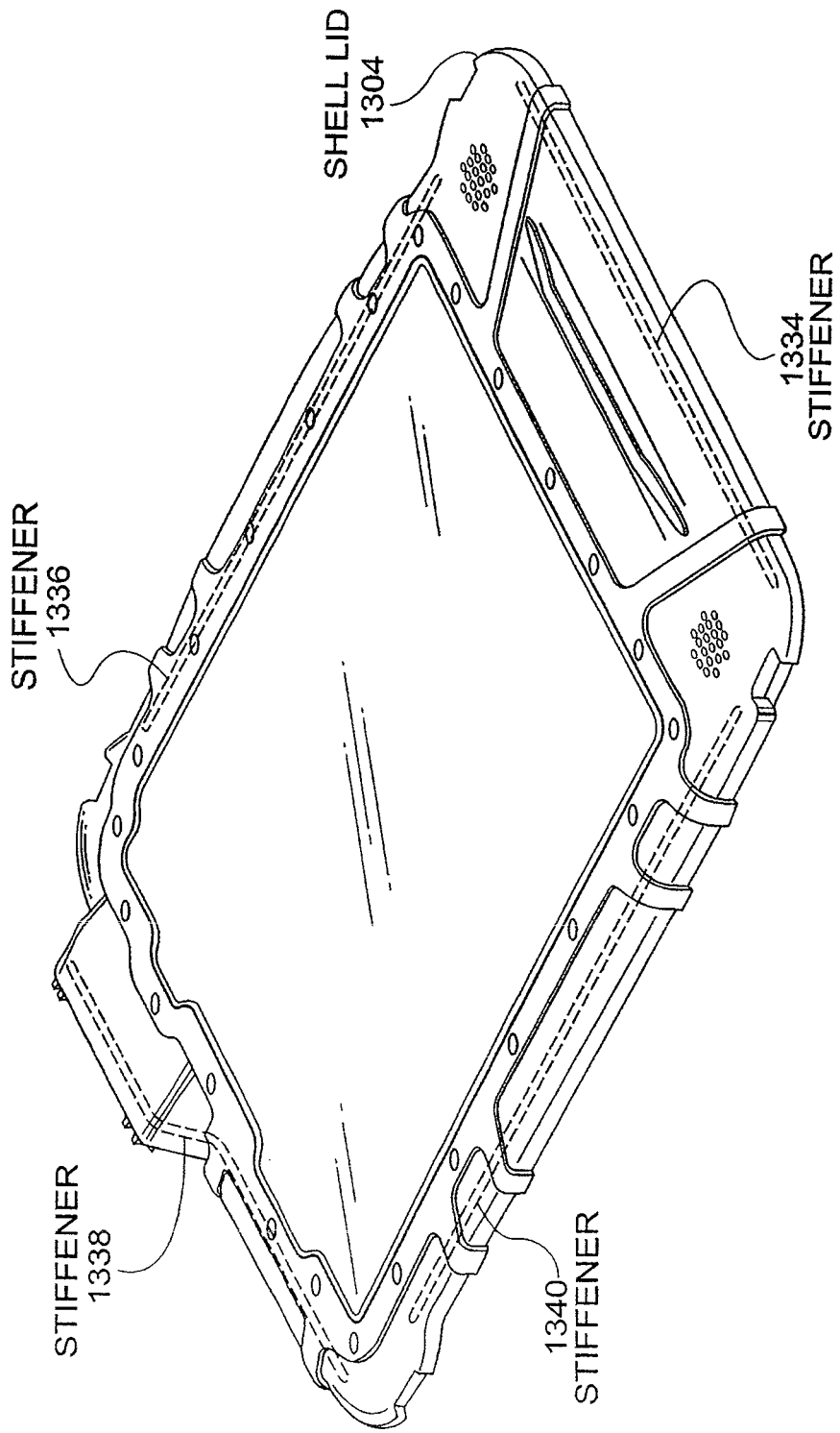
FIG. 13B is a view of the protective enclosure lid of FIG. 13A.

FIG. 13B illustrates a shell lid 1304 of the embodiment of FIG. 13A. Shell lid 1304 and base 1312 may be made of impact/crush resistant material such as glass-fiber reinforced engineered thermoplastic, such as for example, glass reinforced polycarbonate. Alternatively, the shell lid 1304 and shell base may be made of thermoplastic polycarbonate, thermoplastic polypropylene, thermoplastic acrylonitrile-butadiene-styrene, and thermoplastic compositions containing one or more thereof, or other engineered thermoplastics that provide a shock-resistant and impact resistant shell may be used. The engineered thermoplastics may be reinforced with glass fibers, carbon fibers, metal fibers, polyamide fibers and mixtures thereof. Shell lid 1304 may be further reinforced with stiffeners 1334, 1336, 1338, 1340 that are integrally embedded into the shell lid around the perimeter of an opening in the shell that is directly over the interactive flat-panel control portion of the tablet PC. The stiffeners made be made of steel or other hard material so that the stiffeners provide additional strength and prevent flexing of the lid 1304 which enhances the watertightness and the impact/crush resistance.

Figure 14:
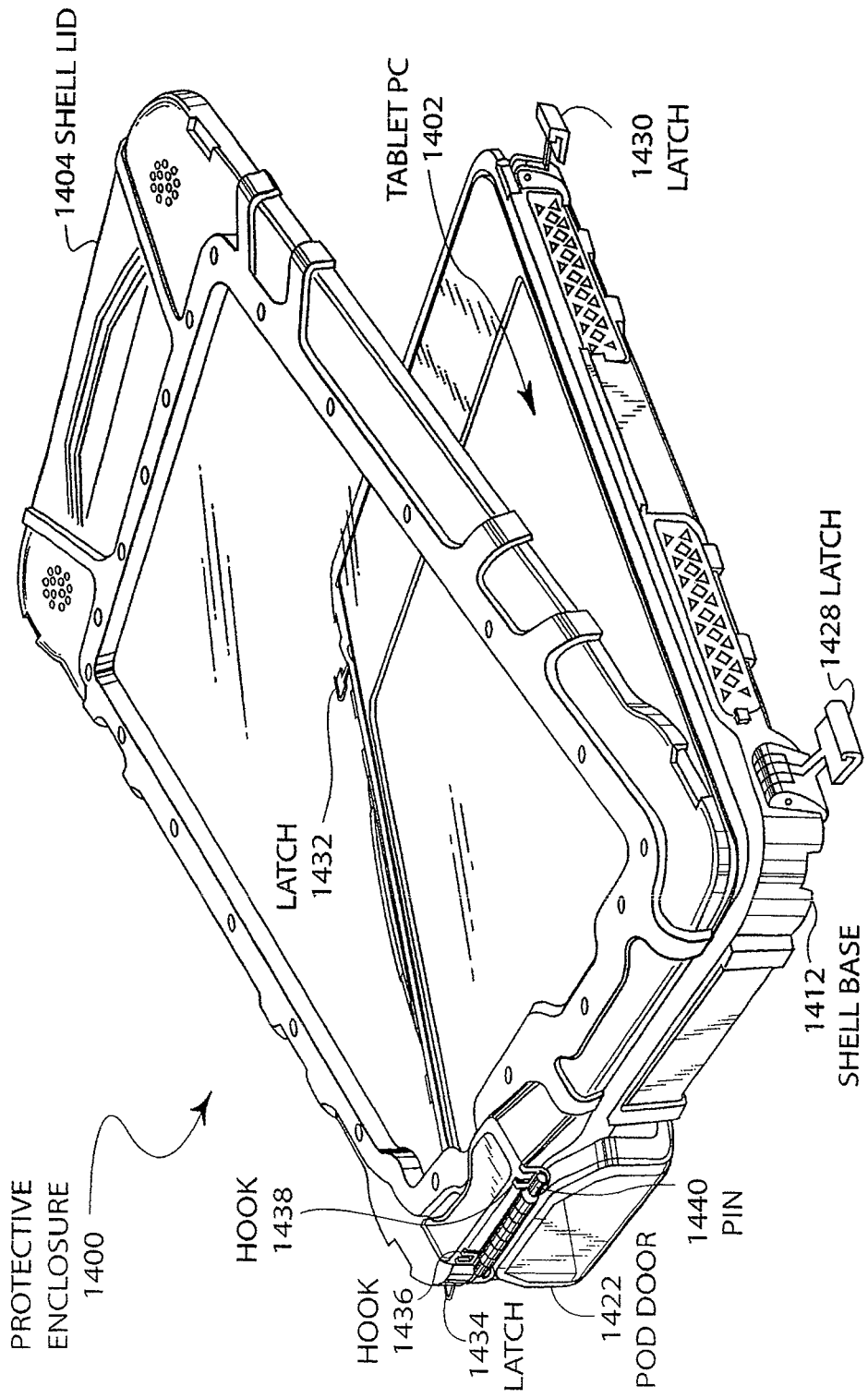
FIG. 14 is a perspective top view of the embodiment of FIG. 13A with an open lid.

FIG. 14 is an illustration of the embodiment of FIG. 13A with the lid 1404 detached from the base 1412. To protect the tablet PC 1402 using the protective enclosure 1400, the tablet PC 1402 is disposed to fit snugly into the base 1412. The lid is oriented so that hooks 1436, 1438 area aligned with pin 1440 that is connected to a portion of the base 1412 and the lid is closed so that hooks 1436, 1438 are retained by pin 1440. Compound latches 1428, 1430, 1432, 1434 are then snapped onto the lid so that the lid is compressed tightly against the base providing a watertight seal.

Figure 15:
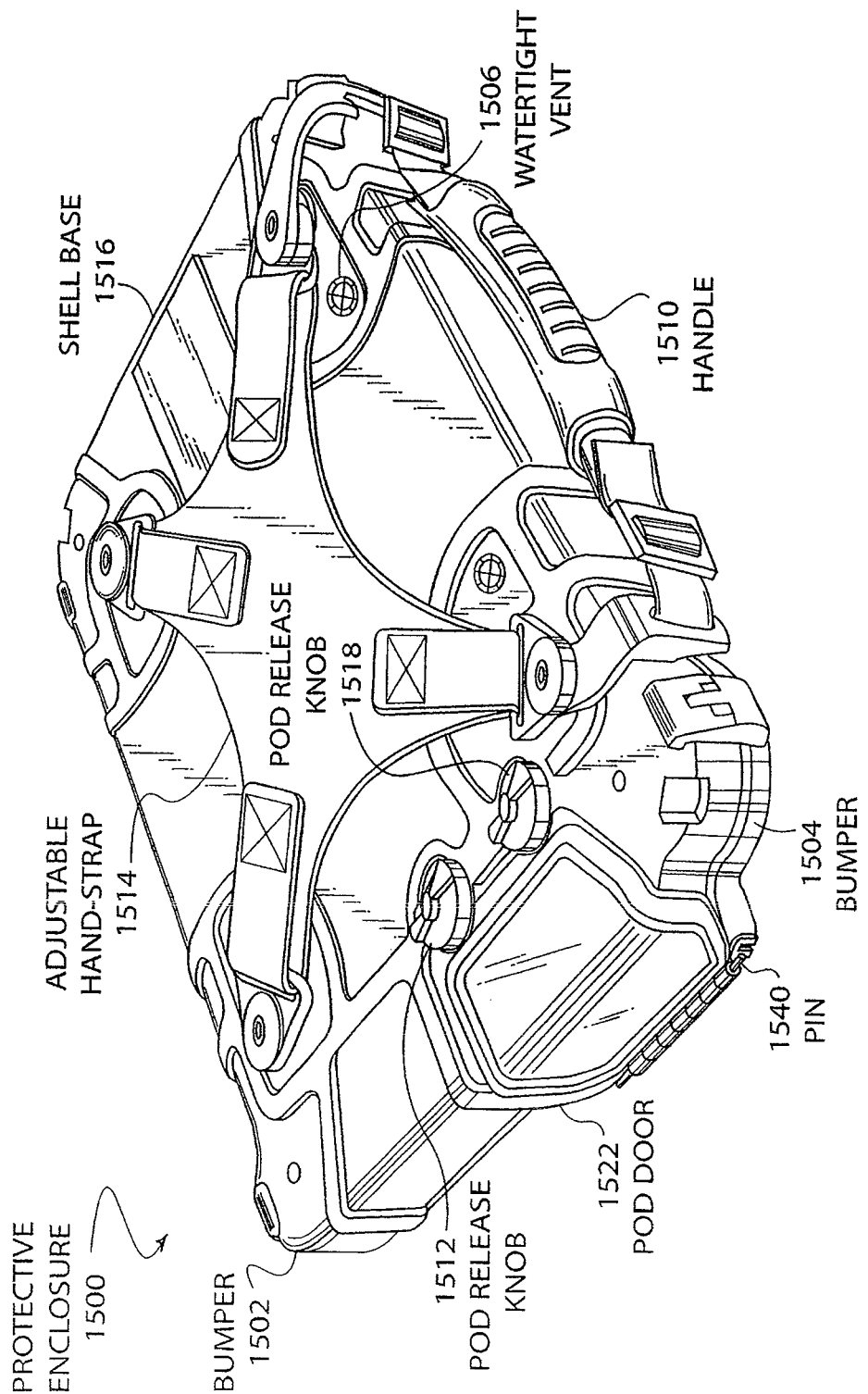
FIG. 15 is a perspective bottom view of the embodiment of FIG. 13A.

FIG. 15 is a bottom view of the embodiment of FIG. 13. The base 1516 of protective enclosure 1500 includes watertight vents such as watertight vent 1506 for air exchange to permit heat and sound dissipation from the enclosed tablet PC while at the same time maintaining watertightness.

Pod release knobs 1512, 1518 are attached to the base 1516 so that the knobs can be rotated clockwise to securely wedge against an edge of pod door 1522 to close the pod door 1522 tightly against a rim around an the pod opening in base 1516 to create a watertight seal. Knobs 1512, 1518 can be rotated counter-clockwise to release pod door 1522 to access the interfaces of the tablet PC covered by pod door 1522.

To provide additional protection against mechanical shock, heavy-duty corner bumpers such as bumper 1504 may be securely attached to the corners of base 1516.

As shown in FIG. 15, an adjustable heavy-duty handle may be attached to the base 1516 of the protective enclosure 1500 to allow easy and reliable transportation of the protective enclosure 1500 that encloses a tablet PC. In some circumstances, it is convenient to hold the protective enclosure using hand strap 1514 that is made of strong slightly stretchable fabric. Hand strap 1514 attaches to four points of the base 1516 to that a user's hand or wrist can be inserted along the either the longer or shorted length on the protective enclosure 1500 and enclosure tablet PC. Hand strap 1514 may be made of neoprene or other strong stretchable material to securely hold the protective enclosure to the user's arm even in slippery conditions. The protective enclosure may further include a neck strap to provide a comfortable solution for using the tablet PC while standing.

Figure 16:
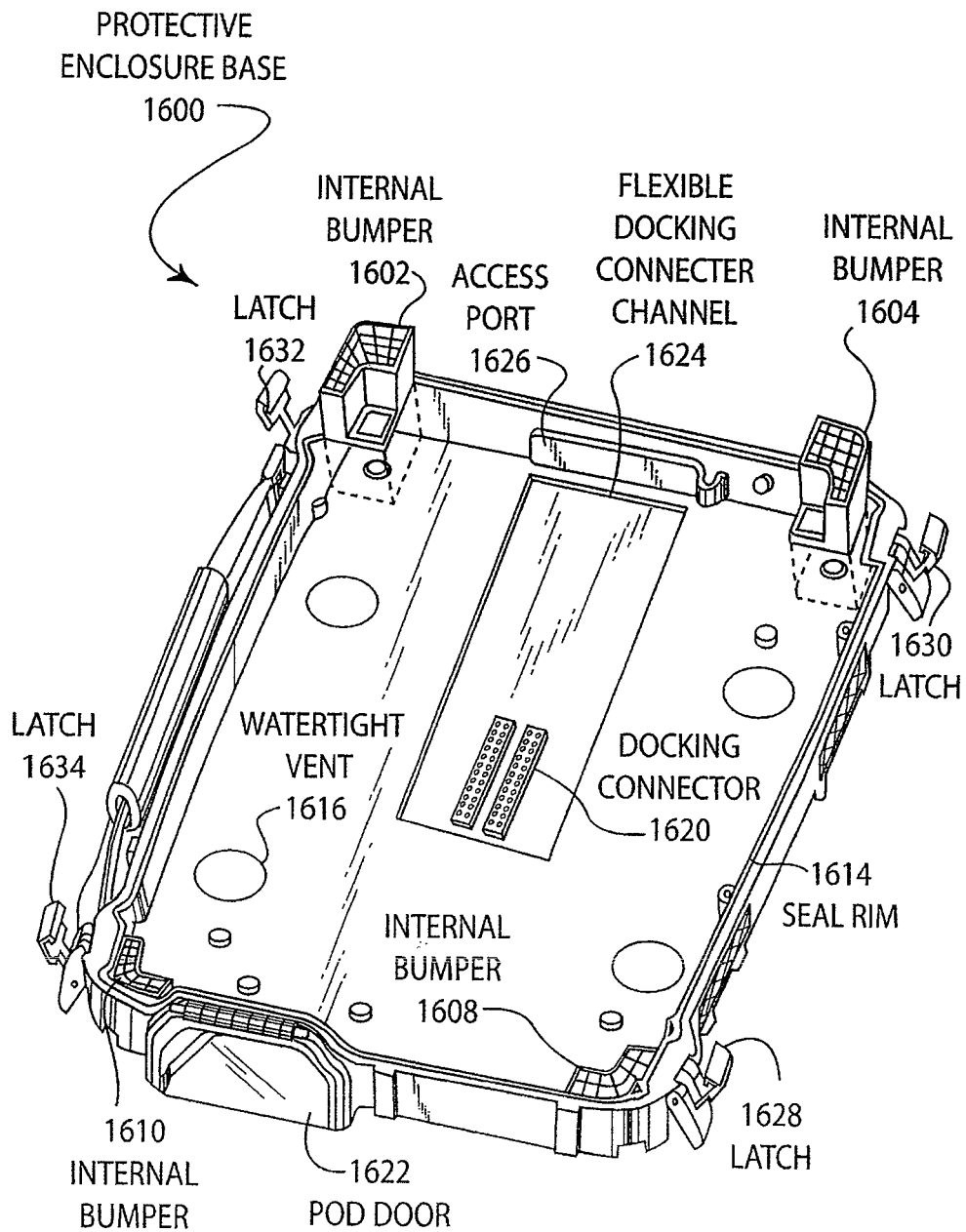
FIG. 16 is a perspective view of the base of the embodiment of FIG. 13A

FIG. 16 illustrates a top view of the protective enclosure base 1600. Watertight vents such as watertight vent 1616 allow air exchange for heat dissipation and sound transmission from an enclosed tablet PC. Seal rim 1614 is an integrally formed part of the protective enclosure 1600 which is compressed against an O-ring in the protective enclosure lid to provide a watertight seal when compound latches 1628, 1630, 1632, 1634 are closed onto the lid.

Internal bumpers 1602, 1604, 1608, 1610 attach to the interior corners of protective enclosure base 1600 to provide cushion and mechanical shock protection to an enclosed tablet PC. The L-shape and non-solid interior of internal bumpers 1602, 1604, 1608, 1610 allows the bumpers to deflect and absorb the shock if the enclosed tablet PC is dropped or otherwise subjected to mechanical shock. The protective enclosure provides shock absorption sufficient to meet MIL-STD 810F, Method 516.5, Procedure 4 which is a Transit Drop Test. In the Transit Drop Test, the protective enclosure encloses a tablet PC or a mass equivalent to a tablet PC. The protective enclosure is sequentially dropped onto each face, edge and corner for a total of 26 drops over plywood from a height of 48 inches. The protective enclosure is visually inspected after each drop and a functional check for leakage is performed after all drops are completed.

Some tablet PCs have a docking connector disposed on the underside of the tablet PC so that the tablet PC can connect to power and signals. For example, emergency vehicles such as ambulances, fire trucks, or patrol cars, may have a docking station installed near the driver's seat onto which the driver may dock a tablet PC. The embodiment of protective enclosure base 1600, as illustrated in FIG. 1, may comprise a docking connector channel 1624 that is recessed with respect to the upper surface of the base that allows a docking connector to run from a docking connector that is disposed in the center underside of the tablet PC to access port 1626. Alternatively, a docking pass-through connector 1620 may be made an integral and watertight part of the protective enclosure base 1600 so that the tablet PC docking connector attaches to the docking pass-through connector 1620 which, in turn, connects to the docking station in substantially the same manner as an unenclosed tablet PC.

Figure 17:
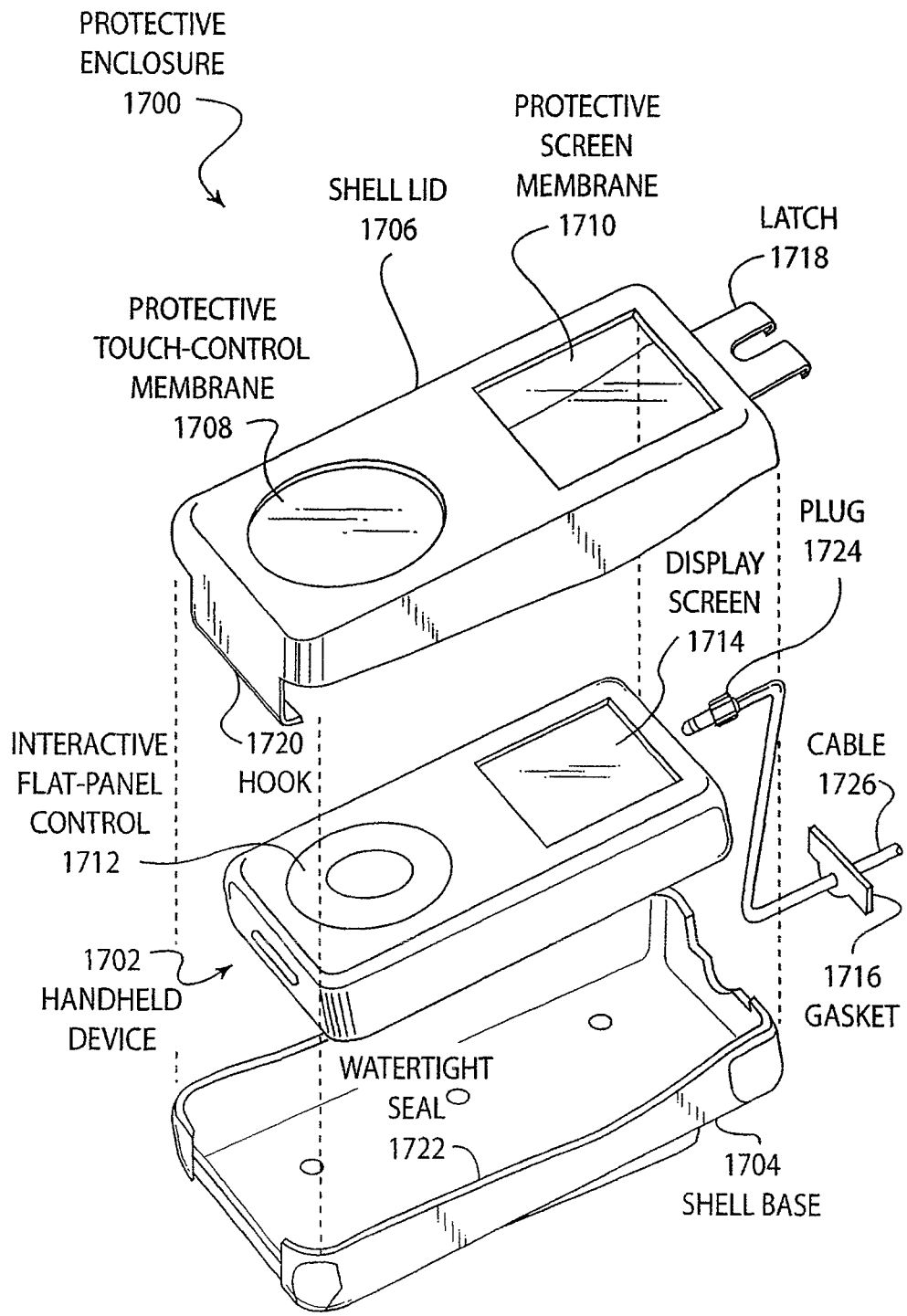
FIG. 17 is an exploded view of an embodiment of a protective enclosure for an interactive flat-panel controlled device.

FIG. 17 illustrates another embodiment of protective enclosure 1700 for a handheld electronic device 1702 that has an interactive flat-panel control such as, but limited to, a capacitance-sensing interactive flat panel control, a touch screen or other interactive control. Handheld electronic devices that have an interactive flat-panel control benefit from being enclosed in a rugged protective enclosure that is crush-resistant, watertight and shock-resistant and that simultaneously allows the user to interact with a sensitive interactive flat-panel control. Handheld electronic devices that have interactive flat-panel control may include music players, MP3 players, audio player/recorders, video players, computers, personal digital assistants (PDAs), GPS receivers, cell phones, satellite phones, pagers, monitors, etc. For example, Apple Computer Ipod is a popular handheld interactive device that plays MP3 or otherwise digitally-encoded music/audio. The Apple Ipod has an interactive flat-panel control in which a portion of the front panel is a flat-panel display and portion of the front panel is an interactive flat-panel control, called a touch wheel in some versions of the Ipod and click wheel in other versions of the Ipod, that has capacitive touch/proximity sensors. One function of such an interactive flat-panel control, i.e. touch wheel, is that the control can emulate a rotary control knob by sensing circular motion of a user's finger using capacitive sensors. The click wheel has the same function with the additional feature of sensing proximity of a user's finger and emulating button presses by a user's finger at pre-determined areas.

In the embodiment of FIG. 17, the shell lid 1706 and the shell base 1704 are made of polycarbonate or other engineered thermoplastics such as polyethylene, polypropylene, etc. that are crush-resistant and impact resistant. Shell base 1704 has a watertight seal 1718, which may be an overmolded gasket, o-ring, liner or other seal that prevents water from entering the protective enclosure 1700 when the handheld interactive device 1702 is enclosed inside the protective enclosure 1700. Shell base 1704 and shell lid 1706 may include watertight vents, electrical connectors, see-through areas or features as disclosed with respect to FIG. 1.

In the embodiment of FIG. 17, shell lid 1706 includes apertures over predetermined portions of the handheld interactive device 1702, such as the areas directly over the display screen 1714 and the interactive flat-panel control 1712, or other designated areas, as desired. A protective screen membrane 1710, that is at least partially transparent, is permanently or removably fixed in a watertight manner to the underside of shell lid 1706 in the aperture that is over the display screen 1714. The protective screen membrane 1710 may be recessed with respect to the upper surface of the shell lid 1706 which provides protective elevated rim that protects the display screen 1714 from breakage. Protective screen membrane 1710 may be PVC, silicone, polyethylene or other material that is watertight and rugged. In the case that display screen 1714 is a touch screen, the protective screen membrane 1710 should be smooth enough and thin enough that stylus strokes and other inputs are transmitted accurately to the touch screen as disclosed above with respect to FIG. 1, FIG. 12, and FIG. 13. Alternatively, it may be desirable not to have an aperture in shell lid 1706 for a protective membrane 1710. In another embodiment, the shell lid 1706 can be made of a transparent material so that a transparent window can be foamed in the shell lid 1706 in place of the protective screen membrane 1710. The transparent window is aligned with the display screen 1714 so that the user can view the display screen 1714. In this case, a protective elevated rim that is aligned with the display screen 1714 is not required in the shell lid 1706 to protect the display screen 1714 from damage since there is no protective screen membrane 1710. If the display screen 1714 is a touch screen, the material of the shell lid 1706 that is aligned with the display screen 1714 to provide a window can be made thinner to allow the touch screen to properly operate.

As also shown with respect to the embodiment of FIG. 17, a protective control membrane 1708 is permanently or removably fixed in a watertight manner to the underside of shell lid 1706 in an aperture that is aligned with the interactive flat-panel control 1714 of the handheld device 1702. The protective screen membrane 1710 is recessed with respect to the upper surface of the shell lid 1706 which provides protective elevated rim that protects the display screen 1714 from breakage and provides tactile feedback that guides a user's finger to the desired area, even in slippery conditions. Of course, the protective elevated rim may simply comprise the portion of the shell lid 1706 that is formed as a result of making an aperture in the shell lid 1706 and overmolding a protective touch-control membrane 1708 on an inside surface of the shell lid 1706. In other words, the thickness of the shell lid 1706 creates a protective rim since the protective touch-control membrane 1708 is overmolded or otherwise attached to the back side of the shell lid 1706. In that case, the rim is not elevated with respect to the surface of the shell lid 1706, but rather, is elevated with respect to the membrane to form a protective rim.

Interactive flat-panel control 1712 has capacitive sensors, which are part of a proximity/touch detector circuit. When a grounded object, such as a person's finger, which has free air capacitance of several hundred picofarads, is brought close to the capacitive sensors, the total capacitance measured by the detector circuit increases because the capacitance of the object with free air capacitance adds to the capacitance of the sensors since the total capacitance of two capacitors in parallel is additive. Multiple sensors may also be arranged so that movement of an object with free air capacitance can be detected, for example, movement of a person's finger in a circular motion analogous to turning a mechanical control knob. Some examples of interactive flat-panel controlled PED's include Ipod and Ipod Mini music and audio players from Apple Computer. In some PEDs, such as the Apple Ipod, capacitive sensors may be disposed below a front panel made from a dielectric such as polycarbonate, which has a dielectric constant in the range of 2.2-3.8. In the embodiment of FIG. 17, the protective control membrane 1708 is made of thin polycarbonate that is slightly flexible or other engineered thermoplastics that provide the rugged watertight protection and at the same time permit the capacitive sensors of the interactive flat-panel control 1712 to function correctly. Likewise, a protective control membrane 1708 with a dielectric constant that is too high may retain an electric charge long enough to reduce the response rate of the sensor to motion of a user's finger from one capacitive sensor zone of the interactive flat-panel control 1712 to another. A protective control membrane 1708 that is conductive or has a dielectric constant that is too low may diminish the sensitivity of the capacitive sensor by combining in series the capacitance of the protective membrane and the dielectric front panel of the PED which results in a lowering of the overall capacitance.

Total capacitance between an object, such as a finger touching the protective control membrane 1708, and interactive flat-panel control 1712 is a function of the thickness and the dielectric constant of the protective control membrane 1708. The capacitance between the object, such as a finger, and the capacitive sensors of the interactive flat-panel control 1712 is proportional to the distance between the object and the sensors. The sensitivity of the capacitive sensors to the object may be diminished or completely eliminated if the protective control membrane 1708 is too thick. In the embodiment of FIG. 17, the thickness of the protective control membrane is approximately 0.020 inches. The protective control membrane 1708 may be any thickness in the range of 0.003 inches to 0.020 inches that is adequate to provide a rugged watertight membrane through which capacitance can be correctly sensed by the interactive flat-panel control 1712.

The upper surface of the protective control membrane 1708 has a velvet/matte texture with a texture depth of 0.0004 to 0.003 inches that reduces the surface area of the membrane that is in frictional contact with the user's finger and permits a user's finger to glide rapidly upon the surface of the membrane without catching or sticking as a result of the reduced friction. The hardness of the polycarbonate material, or other hard engineered thermoplastic, also reduces the friction.

Headphones or other accessories may be electrically connected to handheld device 1702 the through the protective enclosure 1700 by disposing the wire of the headphone or accessory in an insertable gasket 1716 which fits snugly into one end of the shell base 1704.

Figure 18:
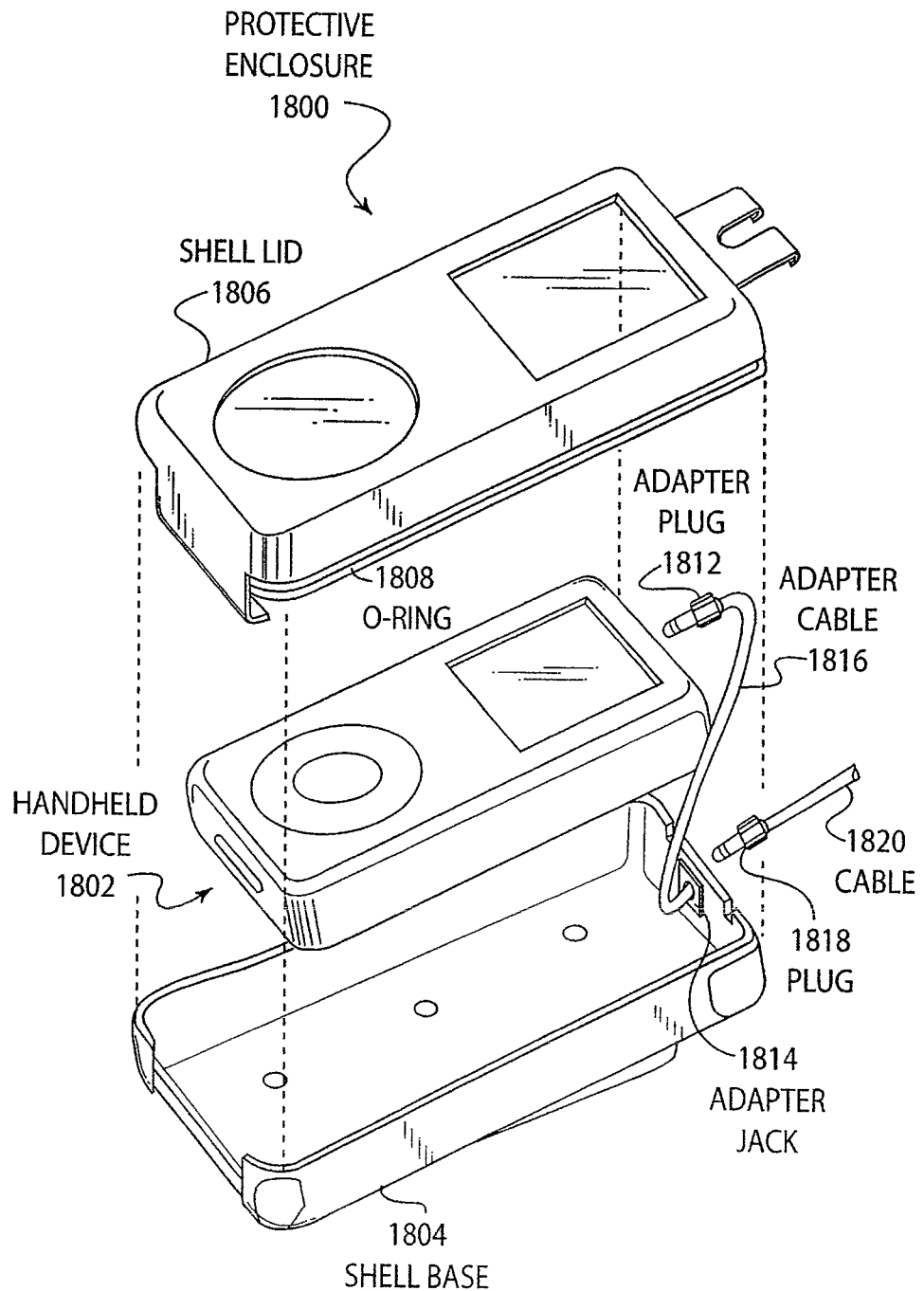
FIG. 18 is an exploded view of another embodiment of a protective enclosure for an interactive flat-panel controlled device.

FIG. 18 illustrates another embodiment of protective enclosure 1800 which is substantially the same as protective enclosure 1700 of FIG. 17. However, protective enclosure 1800 has an alternative electrical pass-through for accessories. In the embodiment of FIG. 18, shell base 1804 includes an adapter cable 1816 that has an adapter plug 1812 at one end which plugs into a jack of handheld device 1802. At the other end of the adapter cable 1816 is an adapter jack 1814 that is molded into, or otherwise integrally made part of, shell base 1804. An external accessory, such as a pair of headphones, may then be plugged into the adapter jack 1814 while the handheld device 1802 in enclosed in protective enclosure 1800. Alternatively, a one-piece adapter that includes both a jack 1814 and a plug 1812 without a cable 1816 may be integrally disposed into shell base 1804.

Shell lid 1806 is adapted to retain an O-ring 1808 that seals the protective enclosure 1800 when shell lid 1806 is latched tightly onto shell base 1804 so that water cannot enter protective enclosure 1800.

Figure 19:
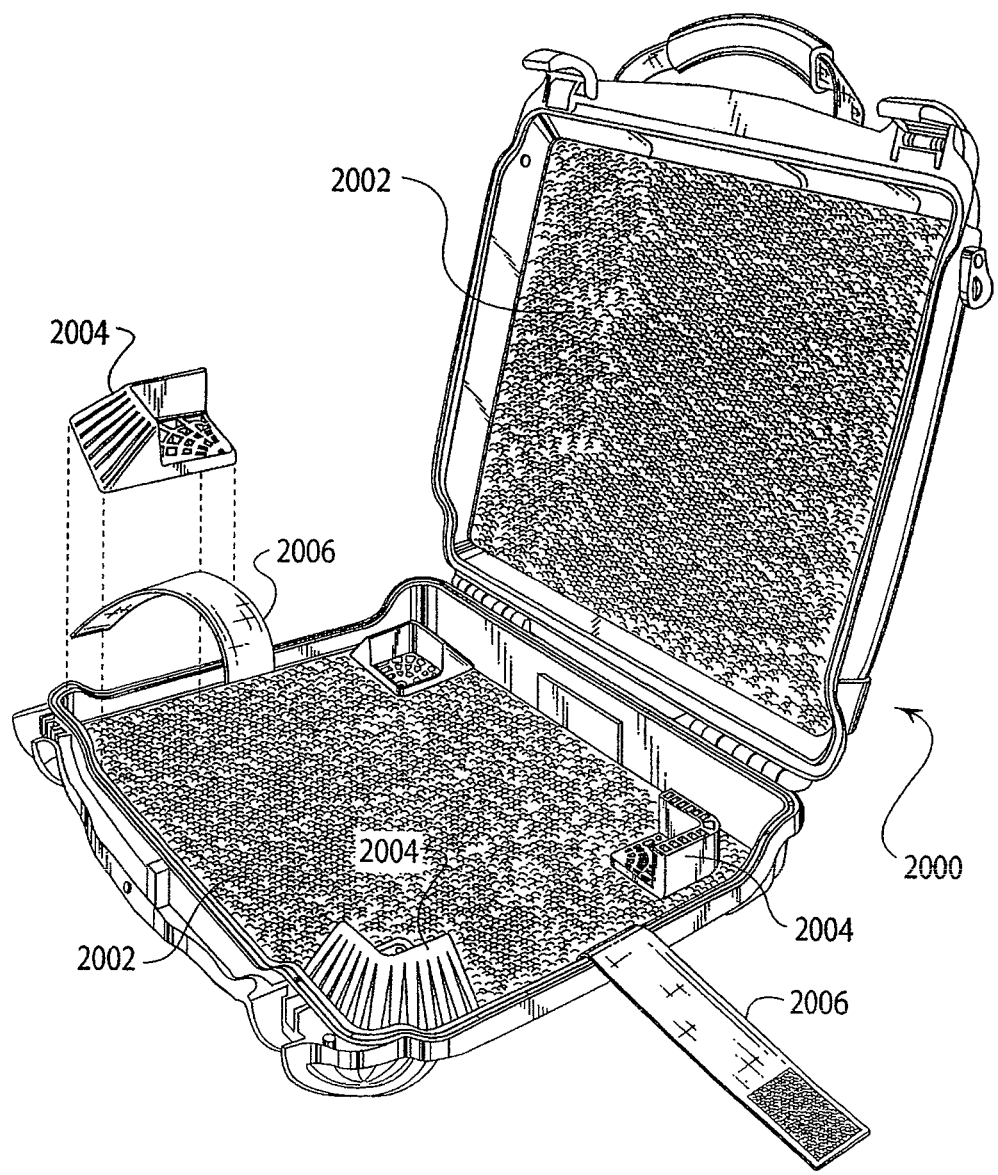
FIG. 19 is an exploded view of another embodiment of a protective enclosure with an open lid for a laptop computer device.

FIG. 19 illustrates in the open position a crush-resistant, impact-resistant, watertight, protective enclosure 2000 for an electronic device such as a laptop computer. The protective enclosure 2000 may be manufactured in a manner similar to the enclosure of FIG. 13 comprising an impact/crush resistant material such as glass-fiber reinforced engineered thermoplastic, such as for example, glass reinforced polycarbonate. It may also be made of thermoplastic polycarbonate, thermoplastic polypropylene, thermoplastic acrylonitrile-butadiene-styrene, and thermoplastic compositions containing one or more thereof, or other engineered thermoplastics that provide a shock-resistant and impact resistant shell.

Figure 20:
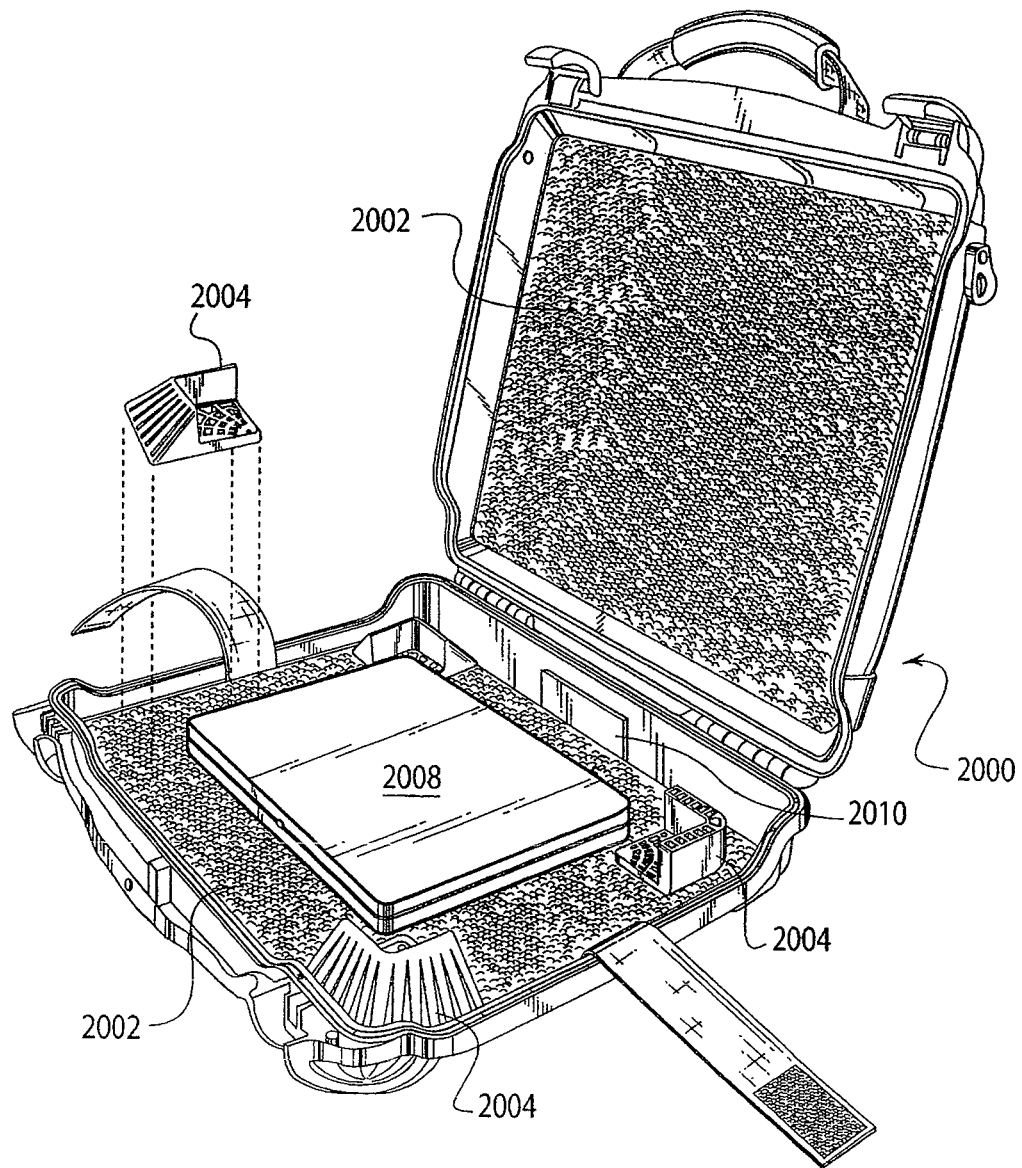
FIG. 20 is an exploded view of a protective enclosure with an open lid for a laptop computer device positioned inside the enclosure.

The inside of the enclosure is covered with a hook and loop liner 2002. Shock absorbing corner bumpers 2004 have hook and loop type bases so that they may attach at any point on the liner inside the enclosure at the corners of the electronic device to secure electronic devices of various sizes and provides a shock absorbent suspension system for the devices. The shape of the bumpers may vary in size and in depth. They may also vary such that the laptop is raised a predetermined height for the bottom of the enclosure so that there may be access to the ports and external drives such as CD and DVD. These bumpers allow the enclosure to be adaptable to any size laptop computer by placing it inside the enclosure and securing it into position with the bumpers 2004. Straps 2006 also secures the laptop into position. FIG. 20 illustrates a laptop 2008 secured in position as described above. An opening for a door or docking position 2010 may be provided that allows the case to be prewired for power or other USB connections. The watertight access ports may include holes that have a moveable watertight plug, or any type of watertight button or lever.

The liner 2002 may also have some cushioning that cushions the laptop and protects it against breakage if the enclosure and laptop are dropped or otherwise subjected to shock. Normally, however, most of the cushioning is provided by the corner bumpers and the liner is not cushioned. In accordance with the embodiment of FIG. 19, the liner 2002 has a thickness of approximately 0.25.

Figure 21:
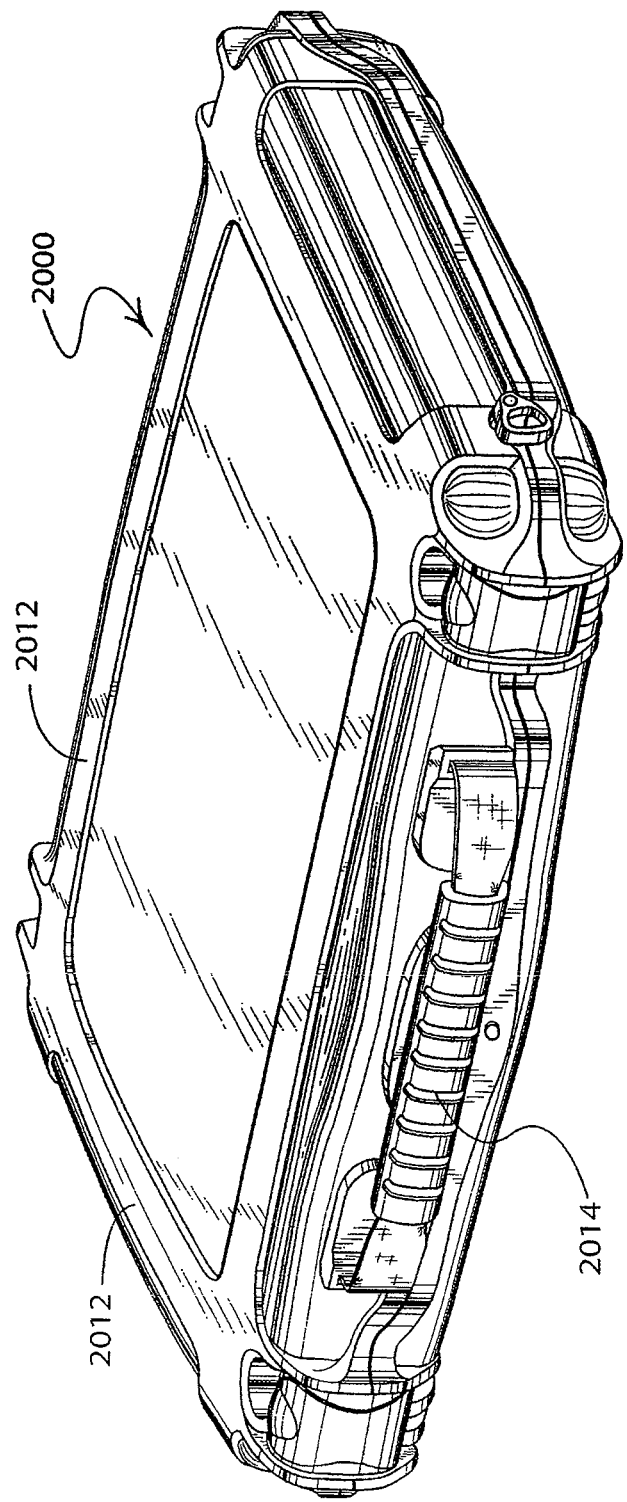
FIG. 21 is a perspective top view of a protective enclosure with a closed lid for a laptop computer device.

This enclosure is also adaptable to protect PC tablets of the type illustrated in FIG. 13A. The hook and loop liner may be adjacent to the touch screen but does not exert mechanical pressure on the touch screen so that mechanical inputs such as style stokes are sensed only when intended. The engineered thermoplastics may be reinforced with glass fibers, carbon fibers, metal fibers, polyamide fibers and mixtures thereof. Referring to FIG. 21 the enclosure 2000 may have an elevated protective rim 2012 substantially surrounding a perimeter of the enclosure. This rim may be further reinforced with stiffeners made of steel or other hard material that are integrally embedded into the enclosure so that the stiffeners provide additional strength and protection to the enclosed devices, as shown in FIG. 13B. An adjustable heavy-duty handle 2016 may be attached to or integrally designed into protective enclosure 2000 to allow easy and reliable transportation.

Figure 22:
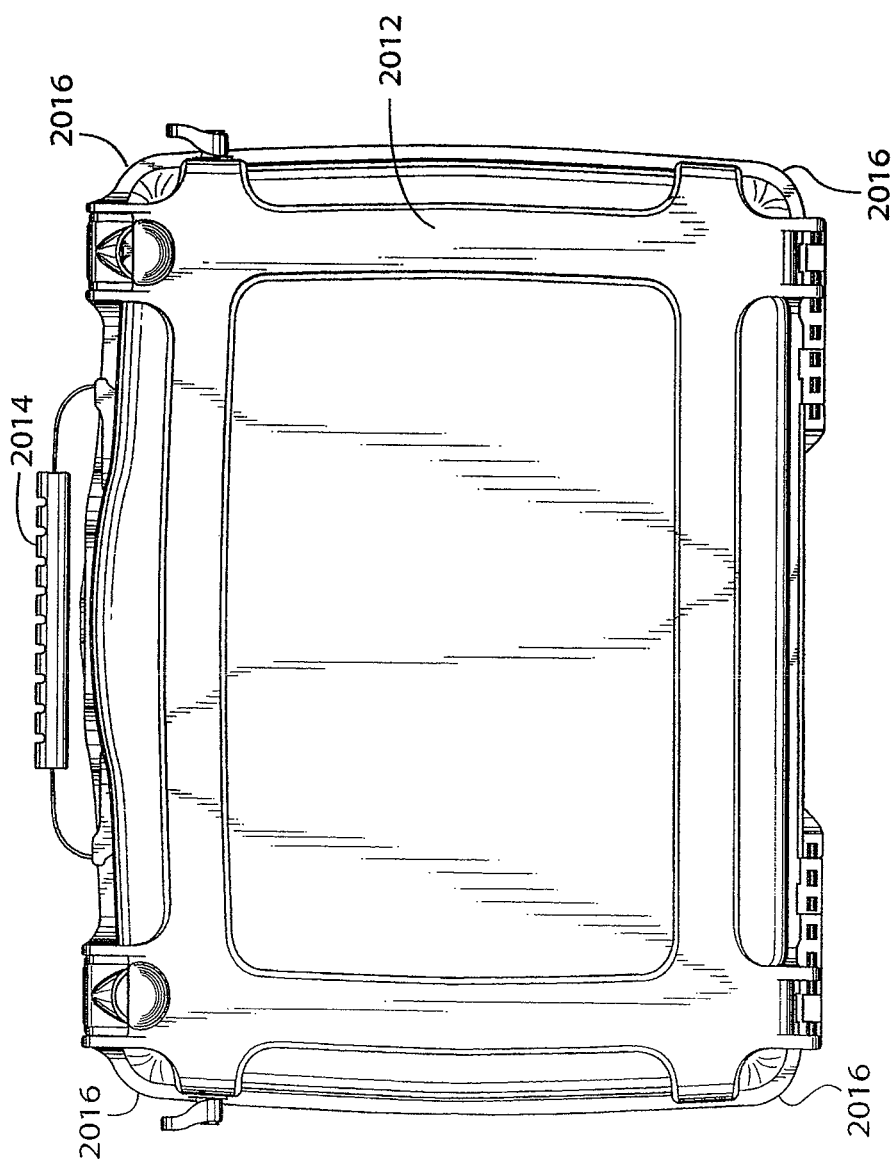
FIG. 22 is a perspective bottom view of the protective enclosure FIG. 21.

FIG. 22 illustrates the top of the enclosure wherein heavy-duty corner bumpers, such as bumper 2016, provide additional protection against mechanical shock and are securely attached to the corners of the base. The ribs 2012 also substantially surround a perimeter of the base of the enclosure.

Figure 23:
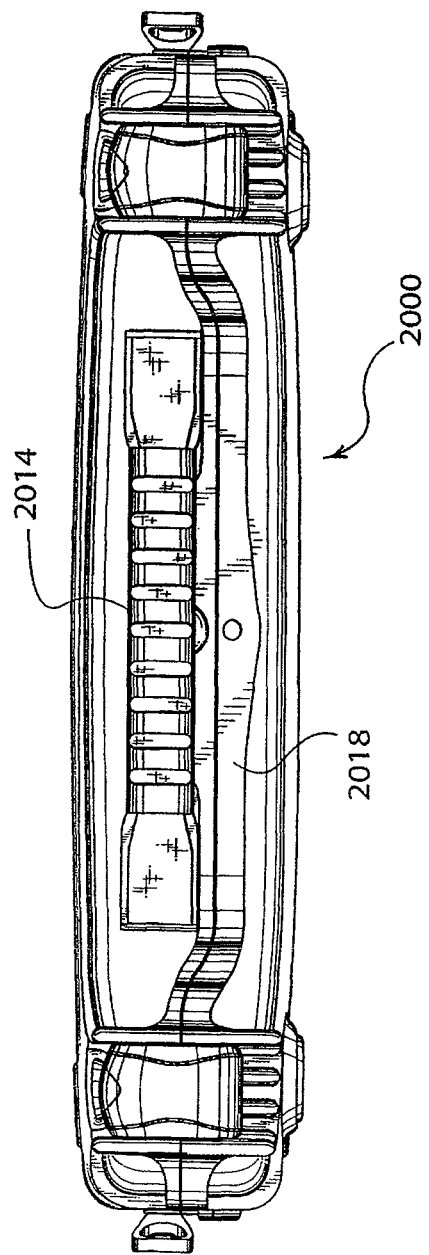
FIG. 23 is a perspective front view of the embodiment of FIG. 21.
Figure 24:
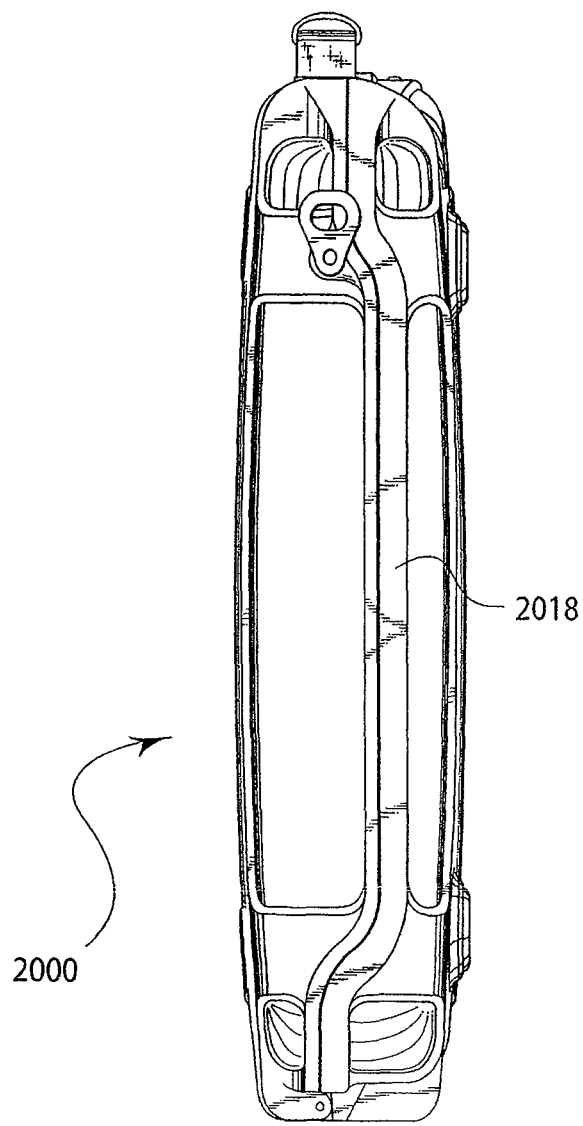
FIG. 24 is a perspective end view of the embodiment of FIG. 21.

FIG. 23 illustrates a front view of the protective enclosure 2000. An addition protective rib 2018 is provided along the front of the case and extends around the case on the ends, as shown in FIG. 24.

Figure 25:
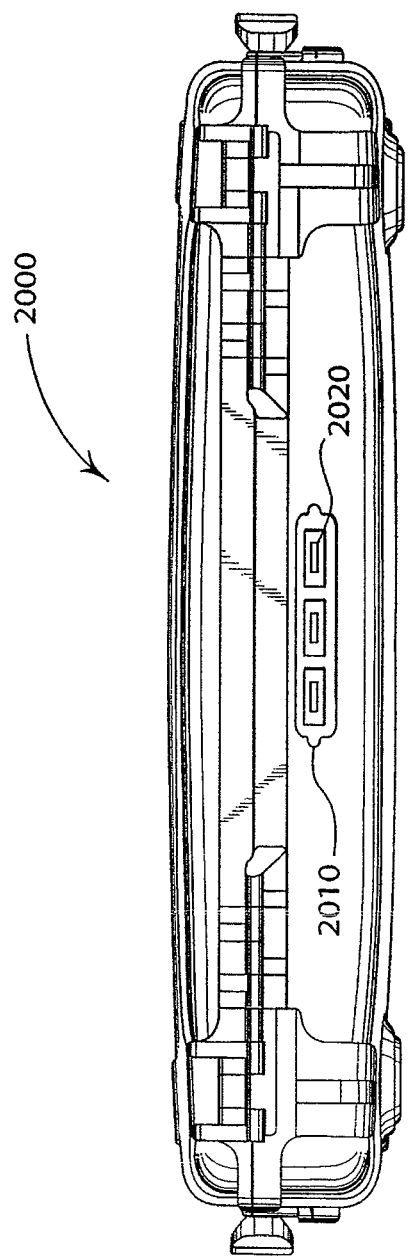
FIG. 25 is a perspective back view of the embodiment of FIG. 21.

FIG. 25 illustrates the back of the protective enclosure wherein an opening 2010 is provided in the protective enclosure 2000 which is sealed with a rubber plug 2020. The plug 2020 of the USB hub is shown in more detail in FIG. 26. The USB cable hub allows the protective enclosure 2000 to be wired for both power as well as USB connections. In addition, provisions may be made to provide ventilation for the enclosure through opening 2010.

Figure 26:
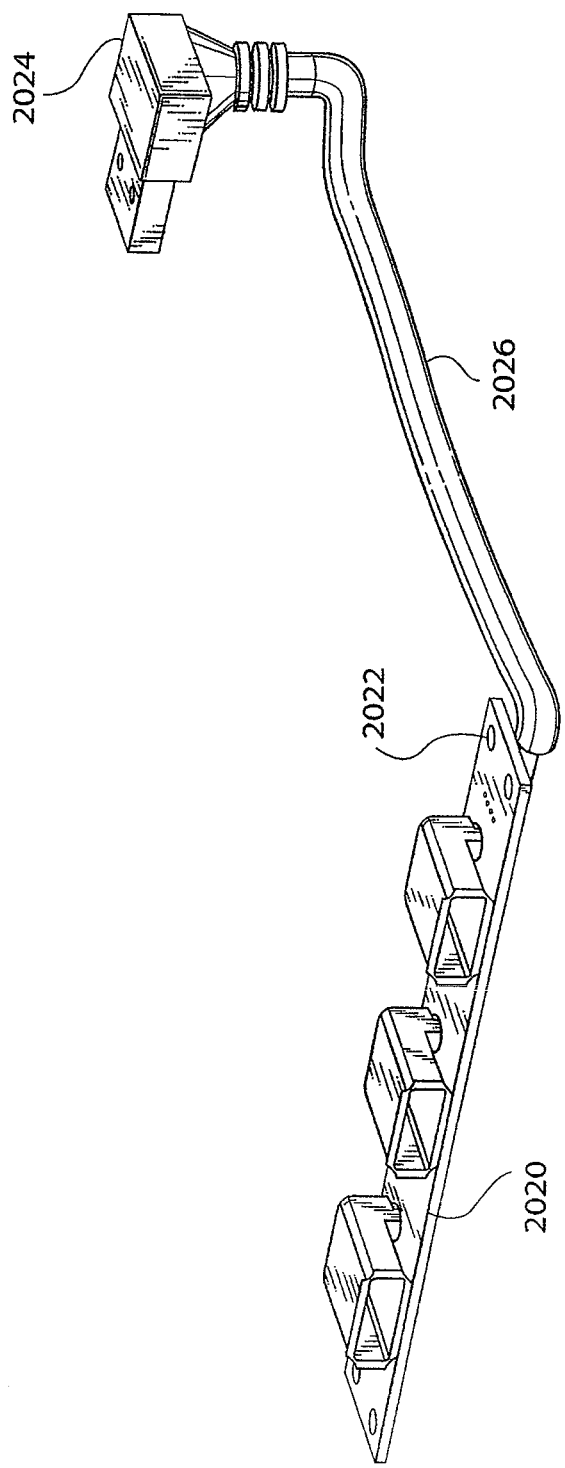
FIG. 26 is a perspective view of the USB hub.

FIG. 26 illustrates the USB hub 2021. The hub has mounting apertures such as 2022 that are disposed to receive fasteners to mount the hub inside of the protective enclosure 2000. A USB connecter 2024, that is disposed to connect to a USB slot in a computer laptop or PC tablet computer, is connected by a cable 2026 to the hub 2020.

Figure 27:
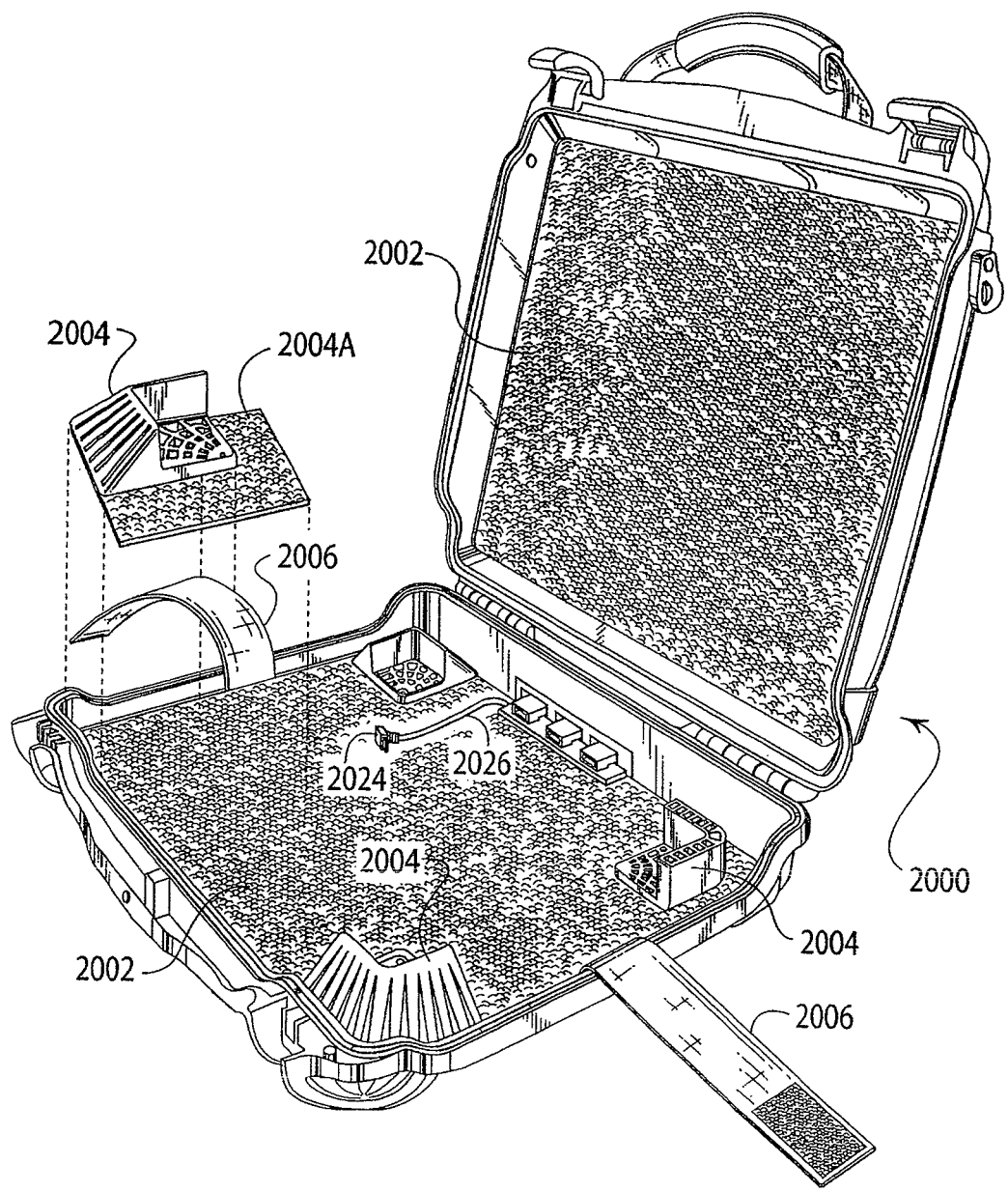
FIG. 27 is a perspective view of the USB hub mounted inside the enclosure of FIG. 21.

FIG. 27 illustrates the integrated USB hub 2021 mounted in the enclosure 2000. The cable 2026 and USB connector 2024 allow a laptop computer or other computer to be connected to the USB hub 2021. The corner bumpers 2004 are disposed to be removeably attached to the enclosure lining 2002 so that the computer may be moved to a new location or the inside of the protective enclosure 2000 to facilitate the making of a connection between a laptop computer and the hub 2020. The hook and loop liner 2005, that is attached to the base of the shock absorbing corner bumpers 2004, extends beyond the base dimensions by a predetermined amount to increase the adhesion between the bumpers 2004 and liner 2002 of the enclosure 2000.

FIG. 28 illustrates how the USB assembly comprising the hub 2021, cable 2026, and connector 2026 may be mounted in an enclosure for a PC tablet protective enclosure such as 1400 shown in FIG. 14.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A protective enclosure for a handheld electronic device having a capacitance-sensing interactive control panel, the protective enclosure comprising:

a shell that surrounds and encloses said handheld device when said handheld device is disposed in said shell, said handheld device being a separate unit from said protective enclosure, said handheld device being insertable in and removable from said enclosure by hand, said shell being substantially crush-resistant and impact resistant, said shell having an aperture that is aligned with said capacitance: sensing interactive control panel; and a protective membrane, distinct from said shell, that is fixed to said shell over an aperture in said shell so that said protective membrane is recessed with respect to an outermost planar extent of said aperture, said protective membrane disposed over said capacitance-sensing interactive control panel of said handheld device when said handheld device is disposed in said enclosure, said protective membrane having a combination of sufficient thinness and a dielectric constant that together allow capacitive inputs on a front side of said protective membrane to be transmitted to said capacitance-sensing interactive control panel through said protective membrane;

wherein said protective membrane has a matte texture, said texture having a texture depth of 0.0004 to 0.003 inches that reduces the surface area of said protective membrane that is in frictional contact with a user's finger and permits said user's finger to glide smoothly upon the surface of the membrane without sticking.

2. The protective enclosure of claim 1 wherein said shell is made from polyethylene.

3. The protective enclosure of claim 1 wherein said protective membrane is releasably fixed to said shell for replacement.

4. The protective enclosure of claim 1 wherein said protective membrane is permanently fixed to said shell.

5. The protective enclosure of claim 1 wherein said protective membrane has a dielectric constant in the range of 2.2 to 3.8.

6. The protective enclosure of claim 1 wherein said protective membrane is made of engineered thermoplastic selected from the group consisting of thermoplastic polycarbonate, thermoplastic polypropylene, thermoplastic acrylonitrile-butadiene-styrene and thermoplastic compositions containing one or more thereof.

7. The protective enclosure of claim 1 wherein said protective membrane has a thickness in the range of 0.003 inches to 0.020 inches.

8. A method of protecting an electronic device having a capacitance-sensing interactive control panel comprising:

providing a protective shell that is crush-resistant and impact-resistant, said protective shell surrounding and enclosing said device when said device is disposed in said protective shell, said device being a separate unit from said protective shell, said device being insertable in and removable from said shell by hand;

providing an aperture in said shell that is aligned with said capacitance-sensing interactive control panel when said device is disposed in said protective shell; and providing a protective membrane, distinct from said shell, that is fixed to said shell so that said protective membrane is disposed over said capacitance-sensing interactive control panel of said device when said device is disposed in said shell and said protective membrane is recessed from an outermost planar extent of said aperture, said protective membrane having a combination of sufficient thinness and dielectric constant that together allow capacitive inputs on a front side of said protective membrane to be communicated to said capacitance-sensing interactive control panel through said protective membrane.

9. The method of claim 8 wherein said protective membrane is releasably fixed to said protective shell for replacement.

10. The method of claim 8 wherein said protective membrane is permanently fixed to said protective shell.

11. A protective enclosure for a handheld electronic device having a capacitance-sensing interactive control panel comprising:

a shell that surrounds and encloses said handheld device when said handheld device is disposed in said shell, said handheld device being a separate unit from said protective enclosure, said handheld device being insertable in and removable from said enclosure by hand, said shell being substantially crush-resistant and impact resistant, said shell having an aperture that is aligned with said capacitance-sensing interactive control panel; and a protective membrane that is fixed to said shell over an aperture in said shell so that said protective membrane is recessed with respect to an outer surface of said shell, said protective membrane having a dielectric constant in the range of 2.2 to 3.8 and being disposed over said capacitance-sensing interactive control panel of said handheld device when said handheld device is disposed in said enclosure, said protective membrane being sufficiently thin and having a dielectric constant that allows capacitive inputs on a front side of said protective membrane to be transmitted to said capacitance-sensing interactive control panel through said protective membrane.

12. A protective enclosure for a handheld electronic device having a capacitance-sensing interactive control panel comprising:

a shell that surrounds and encloses said handheld device when said handheld device is disposed in said shell, said handheld device being a separate unit from said protective enclosure, said handheld device being insertable in and removable from said enclosure by hand, said shell being substantially crush-resistant and impact resistant, said shell having an aperture that is aligned with said capacitance-sensing interactive control panel; and a protective membrane, being a separate unit from said shell, that is disposable across an aperture in said shell so that said protective membrane is recessed with respect to an outermost planar extent of said aperture, said protective membrane disposable over said capacitance-sensing interactive control panel of said handheld device when said handheld device is disposed in said enclosure, said protective membrane having a combination of sufficient thinness and a dielectric constant that together allow capacitive inputs on a front side of said protective membrane to be transmitted to said capacitance-sensing interactive control panel through said protective membrane;

wherein said protective membrane has a thickness of about 0.003 inches to about 0.020 and a surface having a characteristic that permits a said user's finger to glide smoothly upon the surface of the membrane without sticking and permits capacitive inputs to be transmitted to said capacitance-sensing interactive control panel through said protective membrane.

* * * * *